US011320447B2

(12) United States Patent
Itz et al.

(10) Patent No.: US 11,320,447 B2
(45) Date of Patent: May 3, 2022

(54) APPARATUS FOR MEASURING VELOCITIES OF PROJECTILES

(71) Applicant: NIELSEN-KELLERMAN CO., Boothwyn, PA (US)

(72) Inventors: Garet L. Itz, Austin, TX (US); Weston D. Petersen, Austin, TX (US); Alex J. Sitzman, Austin, TX (US)

(73) Assignee: Nielsen-Kellerman Co., Boothwyn, PA (US)

(*) Notice: Subject to any disclaimer, the term of this patent is extended or adjusted under 35 U.S.C. 154(b) by 76 days.

(21) Appl. No.: 16/906,740

(22) Filed: Jun. 19, 2020

(65) Prior Publication Data
US 2020/0319225 A1 Oct. 8, 2020

Related U.S. Application Data

(63) Continuation of application No. 15/629,443, filed on Jun. 21, 2017, now Pat. No. 10,712,358.

(60) Provisional application No. 62/866,921, filed on Jun. 26, 2019.

(51) Int. Cl.
*G01P 3/66* (2006.01)
*G01R 31/315* (2006.01)
*G01P 3/64* (2006.01)

(52) U.S. Cl.
CPC ............... *G01P 3/665* (2013.01); *G01P 3/64* (2013.01); *G01P 3/66* (2013.01); *G01R 31/315* (2013.01)

(58) Field of Classification Search
CPC .... G01P 3/66; G01P 3/665; G01P 3/64; G01P 3/685; G01P 3/42; G01P 15/105; G01P 15/0885; G01R 31/315; H01S 5/02
See application file for complete search history.

(56) References Cited

U.S. PATENT DOCUMENTS

| | | | |
|---|---|---|---|
| 2,400,189 A | 5/1946 | Carlson et al. | |
| 4,483,190 A * | 11/1984 | Cornett | F41A 21/32 102/209 |
| 4,677,376 A | 6/1987 | Ettel et al. | |
| 4,734,870 A | 3/1988 | Snyder et al. | |
| 6,064,196 A | 5/2000 | Oberlin et al. | |
| 6,563,302 B1 | 5/2003 | Raposa et al. | |
| 7,604,420 B2 | 10/2009 | Moody et al. | |
| 2006/0060076 A1 | 3/2006 | Dueck et al. | |
| 2006/0290346 A1 | 12/2006 | Habenschaden et al. | |
| 2008/0190191 A1 | 8/2008 | Martin et al. | |
| 2010/0283724 A1 | 11/2010 | Boutillon et al. | |
| 2012/0006948 A1* | 1/2012 | Hiss | F16L 3/1091 248/74.1 |
| 2012/0167437 A1* | 7/2012 | Holmberg | F16M 13/022 42/90 |

(Continued)

*Primary Examiner* — Son T Le
(74) *Attorney, Agent, or Firm* — Cozen O'Connor

(57) ABSTRACT

An apparatus for measuring velocities of projectiles launched from firearms is disclosed. The apparatus includes a stationary clamp arm and a movable clamp arm works in concert with the stationary clamp arm for clamping the apparatus to a firearm. A thumb screw is employed to secure the movable clamp arm and the stationary clamp arm to the firearm. A sensor module, which is integrated to the stationary clamp, includes a first and second sensor coils, a first magnet adjacent to the first sensor coil, and a second magnet adjacent to the second sensor coil.

16 Claims, 18 Drawing Sheets

(56) References Cited

U.S. PATENT DOCUMENTS

2016/0201706 A1* 7/2016 Heim ................... A45B 9/00
403/110

* cited by examiner

APPARATUS FOR MEASURING VELOCITIES OF PROJECTILES

RELATED PATENT APPLICATIONS

This application claims the benefit of U.S. provisional patent application Ser. No. 62/866,921, filed Jun. 26, 2019, for the subject matter disclosed therein; additionally, this application claims priority to U.S. patent application Ser. No. 15/629,443, filed Jun. 21, 2017, which is a continuation of U.S. patent application Ser. No. 13/608,996, filed Sep. 10, 2012 (now U.S. Pat. No. 9,709,593), which in turn claims the benefit of U.S. provisional patent application Ser. No. 61/626,486, filed Sep. 28, 2011. The disclosures of each of the foregoing applications are hereby incorporated herein by reference in their entireties.

TECHNICAL FIELD

The present invention relates to velocimeters in general, and in particular to a velocimeter for measuring velocities of projectiles launched from firearms.

BACKGROUND

The velocity of a projectile can affect the parabolic flight path of the projectile that determines where the projectile will impact. Thus, it is useful to know the velocity of a projectile in many instances.

Chronographs or velocimeters have been employed to measure the velocities of projectiles for hundreds of years. Early chronographs used a ballistic pendulum to measure the momentum of a projectile, and dividing the momentum of the projectile by the mass of the projectile yields the velocity of the projectile. With the development of more precise measuring instruments, the time for a projectile to traverse a known distance can be more accurately measured, and dividing the distance by the time yields the velocity of the projectile.

Some chronographs measure the speed of a projectile passes between two optical sensor "screens" that detect the projectile based on the projectile obstructing light from a light source. There are several drawbacks to this type of chronographs. For example, they are often cumbersome and require setting up at downrange of a gun. Placement a chronograph downrange leaves it vulnerable to being unintentionally damaged or destroyed by shooters. Also, a shooter must shoot within the sensor screens in order to get a measurement that limits the area in which the shooter may shoot without moving the chronograph and/or the gun.

Some chronographs use a doppler radar for measuring the velocity of a projectile. While doppler radar chronographs are not sensitive to light, they have their own drawbacks, such as the need to set up near a shooter, significant battery drain, and a limited field of view.

Consequently, it would be desirable to provide an improved chronograph that is capable of avoiding some or all of the limitations of existing chronographs.

SUMMARY OF THE INVENTION

In accordance with one embodiment, an apparatus for measuring velocities of projectiles launched from firearms includes a stationary clamp arm and a movable clamp arm works in concert with the stationary clamp arm for clamping the apparatus to a firearm. A thumb screw is employed to secure the movable clamp arm and the stationary clamp arm to the firearm. A sensor module, which is integrated to the stationary clamp, includes a first and second sensor coils, a first magnet adjacent to the first sensor coil, and a second magnet adjacent to the second sensor coil.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

1. First Embodiment

Figure 1:
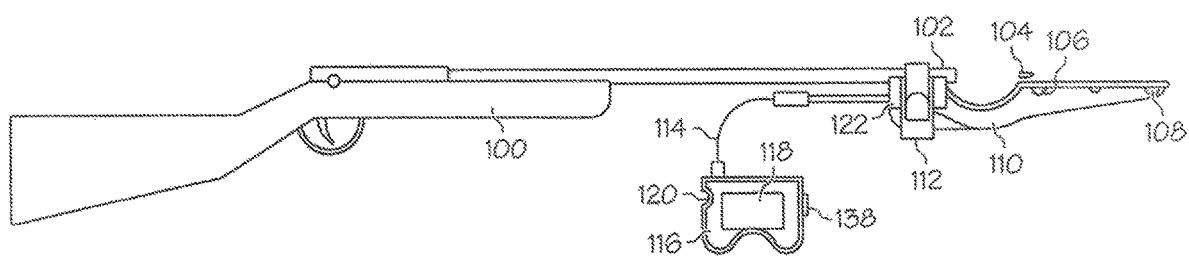
FIG. 1 depicts an apparatus for measuring velocities of projectiles, in accordance with a first embodiment.

Referring now to the drawings and in particular to FIG. 1, there is illustrated an apparatus for measuring velocities of projectiles, according to a first embodiment. As shown, an apparatus for measuring velocities of projectiles includes a sensor module 110 and a controller 116. Sensor module 110 includes a mounting cradle 122, a cam mechanism 112, and a pair of sensor coils 106, 108. Mounting cradle 122 is configured to be mounted on a muzzle of a firearm, such as a muzzle 102 of a firearm 100. Cam mechanism 112 can be used to secure sensor module 110 to muzzle 102.

Controller 116 includes a user input device 120 and a display 118. User input device 120 receives inputs from a user, and display 118 displays results to the user. Controller 116 also includes a slot 138 for receiving a removable memory device that allows a user to store data and transport the data to a separate computing device. Controller 116 is connected to sensor module 110 via a cable 114. Cable 114 is preferably a retractable flexible cable. Alternatively, controller 116 can be integrated into sensor module 110.

As a projectile 104 passes over each of sensor coils 106 and 108 in sequence, voltages are produced across each of sensor coils 106 and 108 in a manner that will be described infra. These voltages are then transmitted to controller 116, via cable 114 or wirelessly, for controller 116 to determine the velocity of projectile 104.

Figure 2A:
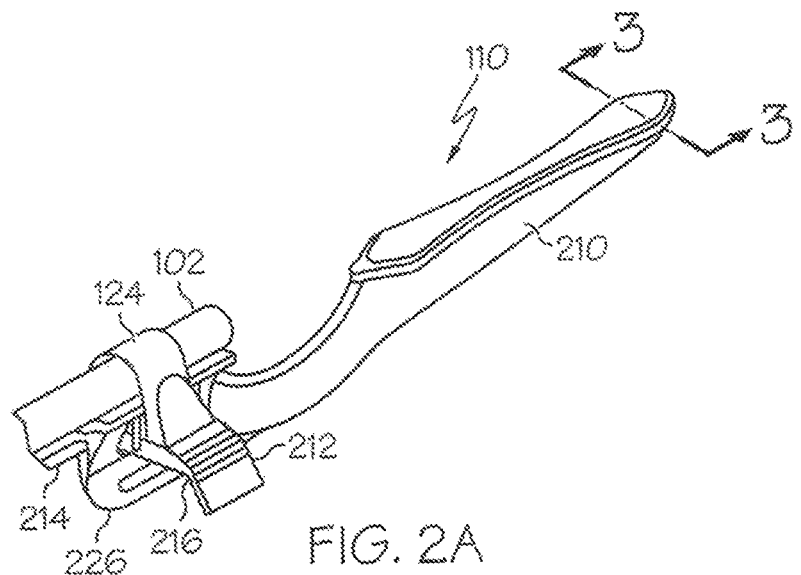
FIGS. 2A-2B are perspective views of a sensor module of the apparatus from FIG. 1 in an unlocked and locked positions, respectively.

With reference now to FIG. 2A, there is depicted a perspective view of sensor module in an unlocked position. The body of sensor module 110 is largely comprised of a molded plastic structure 210. Stiffener 226 is made from a more rigid material, such as carbon fiber or fiberglass, to provide additional support. Stiffener 226 is partially contained within molded plastic structure 210. Cam mechanism 212 includes a flexible strap 124 and a latching lever 212. Flexible strap 124 can be made from a hook and loop fastener, woven fabric, or rubber. Wire lead 214 is largely contained in a channel formed by molded plastic structure 210 and stiffener 226 so as to protect it from the muzzle blast of a firearm.

Figure 2B:
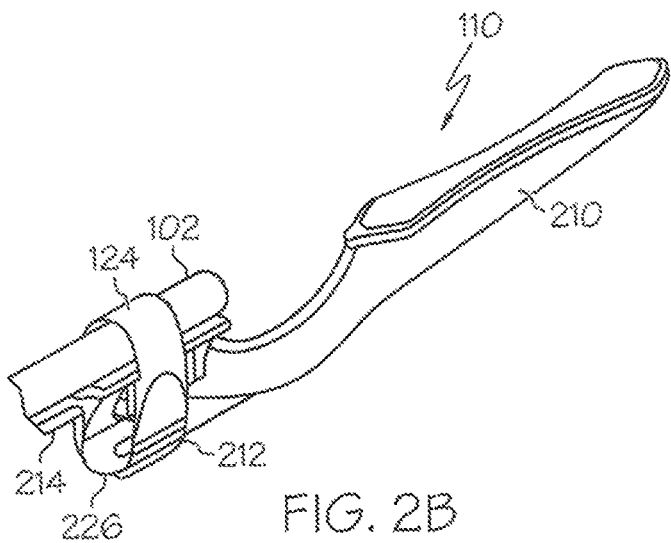

FIG. 2B depicts sensor module 110 in a locked position. Latching lever lip 216 holds latching lever 212 to stiffener 226. The act of closing latching lever 212 tightens flexible strap 124 around muzzle 102.

Figure 3:
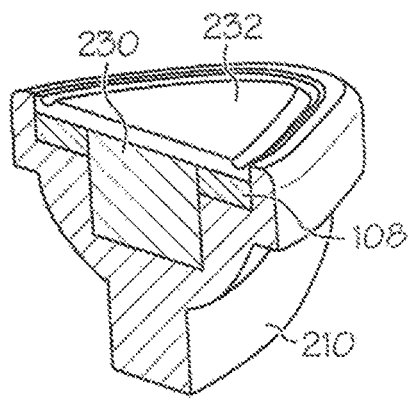
FIG. 3 is a cross-section view of the sensor module from FIG. 2A.

Referring now to FIG. 3, there is illustrated a cross-section view of sensor module 110 along line 3-3 in FIG. 2A. As shown, a permanent magnet 230 is surrounded by molded plastic structure 210. Sensor coil 108 is a wire coil formed within a printed circuit board. Preferably, sensor coil 108 is formed by a metal trace within a printed circuit board. Also, both sensor coils 106 and 108 can be formed by one metal trace within one printed circuit board. Permanent magnet 230 provides a stable magnetic field to sensor coil 108. An n electromagnet made from a separate coil can also be utilized to provide a stable magnetic field to sensor coil 108. A top plate 232 is configured to provide protection for sensor coil 108 and permanent magnet 230 from muzzle blasts.

Figure 4:
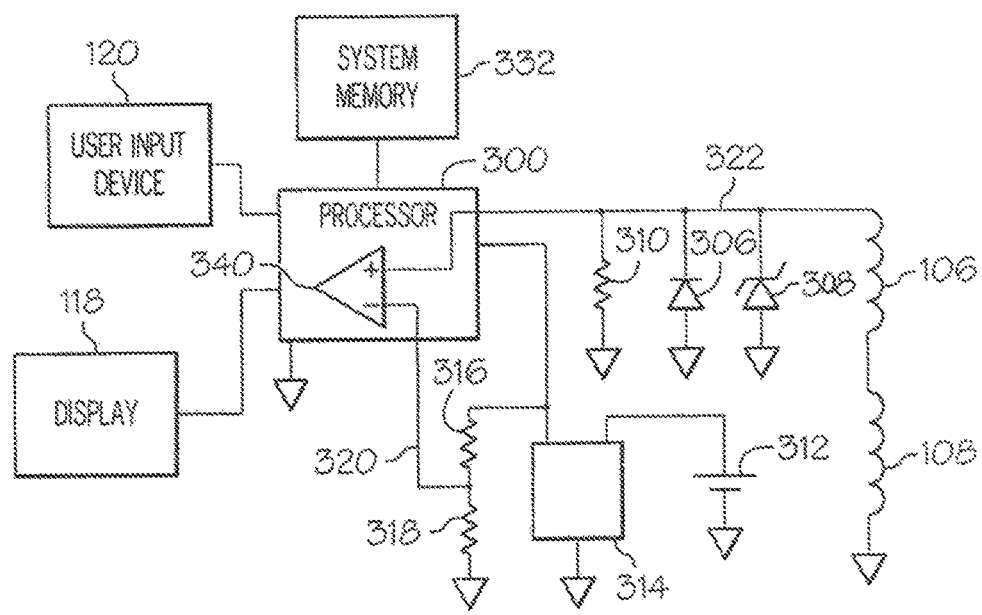
FIG. 4 is a block diagram of a controller of the apparatus from FIG. 1.

With reference now to FIG. 4, there is depicted a block diagram of controller 116 from FIG. 1. As shown, a processor 300 is connected to sensor coils 106 and 108 in series. Processor 300 is protected from excessive positive voltages via a Zener diode 308. In the event that the forward voltage drop across Zener diode 308 is too high, processor 300 is protected from excessive negative voltages via a diode 306. A load resistor 310 is utilized to suppress noise. Multiple passive and active filters can be added to prevent noise from reaching processor 300.

A battery 312 provides a voltage that is regulated by a linear regulator 314. The voltage applied to linear regulator 314 is attenuated through a voltage divider formed by resistors 316 and 318. Alternatively, the voltage divider can also be made adjustable via the use of a potentiometer. The attenuated voltage is applied to processor 300 through a threshold voltage connector 320. Processor 300 contains an analog comparator 340 that is used to compare the voltage on a sensor signal connector 322 and the voltage on threshold voltage connector 320. A user can input information to processor 300 through user input device 120. Display 118 is used to provide visual information to the user. A removable memory device (not shown) can be used to transfer information stored within a system memory 332 to another computing device.

Figure 5:
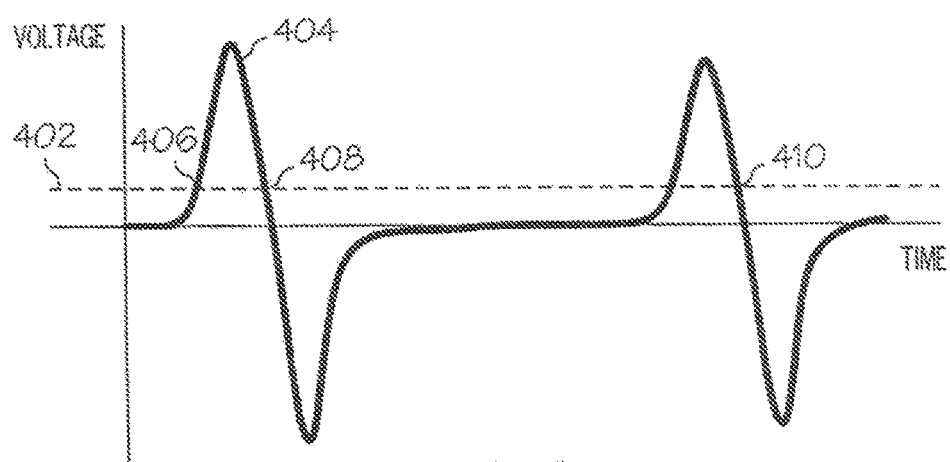
FIG. 5 is a waveform of the signal obtained from the sensor module from FIG. 2A.

Referring now to FIG. 5, there is illustrated a waveform produced by sensor module 110. As shown, a sensor signal 404 corresponds to the voltage on sensor signal connector 322 of FIG. 4, and threshold voltage 402 corresponds to the voltage on threshold voltage connector 320 of FIG. 4. A first positive crossing 406 is the first point at which sensor signal becomes greater than threshold voltage 402. A first negative crossing 408 is the first point, after first positive crossing 406, at which sensor signal 404 becomes less than threshold voltage 402. A second negative crossing 410 is the second point at which sensor signal 404 crosses threshold voltage 402 in the negative direction. It is possible to use multiple voltage thresholds for signal detection or to digitize sensor signal 404 and detect crossings or peaks in the digital domain. It is also possible to replace analog comparator 340 with one or more zero-voltage crossing detectors.

Figure 6:
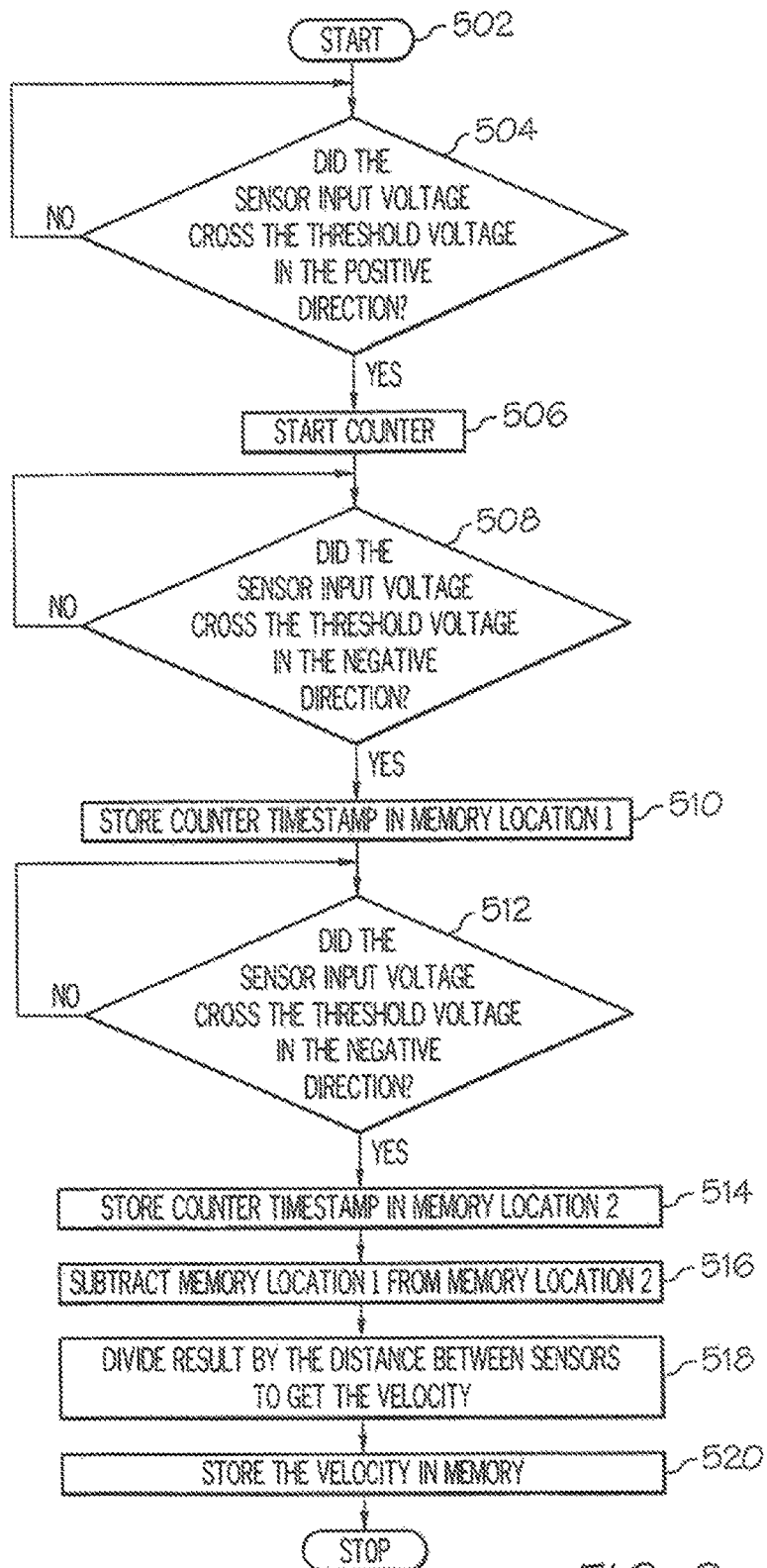
FIG. 6 is a flow diagram of a method for measuring velocities of projectiles launched from firearms.

With reference now to FIG. 6, there is illustrated a flow diagram of a method for measuring the velocity of a projectile launched from a firearm, according to one embodiment. Starting at block 502, a determination is made whether or not a sensor input voltage has crossed a threshold voltage in a positive direction (i.e., first positive crossing 406 from FIG. 5), as shown in block 504. If not, the process returns to block 504. If yes, a counter is started, as depicted in block 506. A determination is then made whether the sensor input voltage has crossed the threshold voltage in the negative direction (i.e., first negative crossing 408 from FIG. 5), as shown in 508. If not, the process returns to block 508. If yes, the counter timestamp is stored in a first memory location, as depicted in block 510.

Next, a determination is made whether or not the sensor input voltage has crossed the threshold voltage in the negative direction again (i.e., second negative crossing 410 from FIG. 5), as shown in 512. If not, the process returns to block 512. If yes, the counter timestamp is stored in a second memory location, as depicted in block 514.

The value stored in the first memory location is then subtracted from the value stored in the second memory location, as shown in block 516. The result from block 516 is divided by the distance between the two sensors to yield the projectile's velocity, as depicted in block 518. The result can be stored in a memory device and/or displayed on a visual output device, as shown in block 520.

Alternatively, the velocity of a projectile can be determined as follows. A key event, such as a zero-voltage crossing, is identified as the voltage changes from a positive value in a first data point to a negative value in a second data point immediately following the first data point (or changing from a negative value to a positive value). Linear interpolation can be used to calculate a zero-voltage timestamp. Parabolic or other curve fits could be used to calculate timestamps from multiple data points.

II. Second Embodiment

Figure 7A:
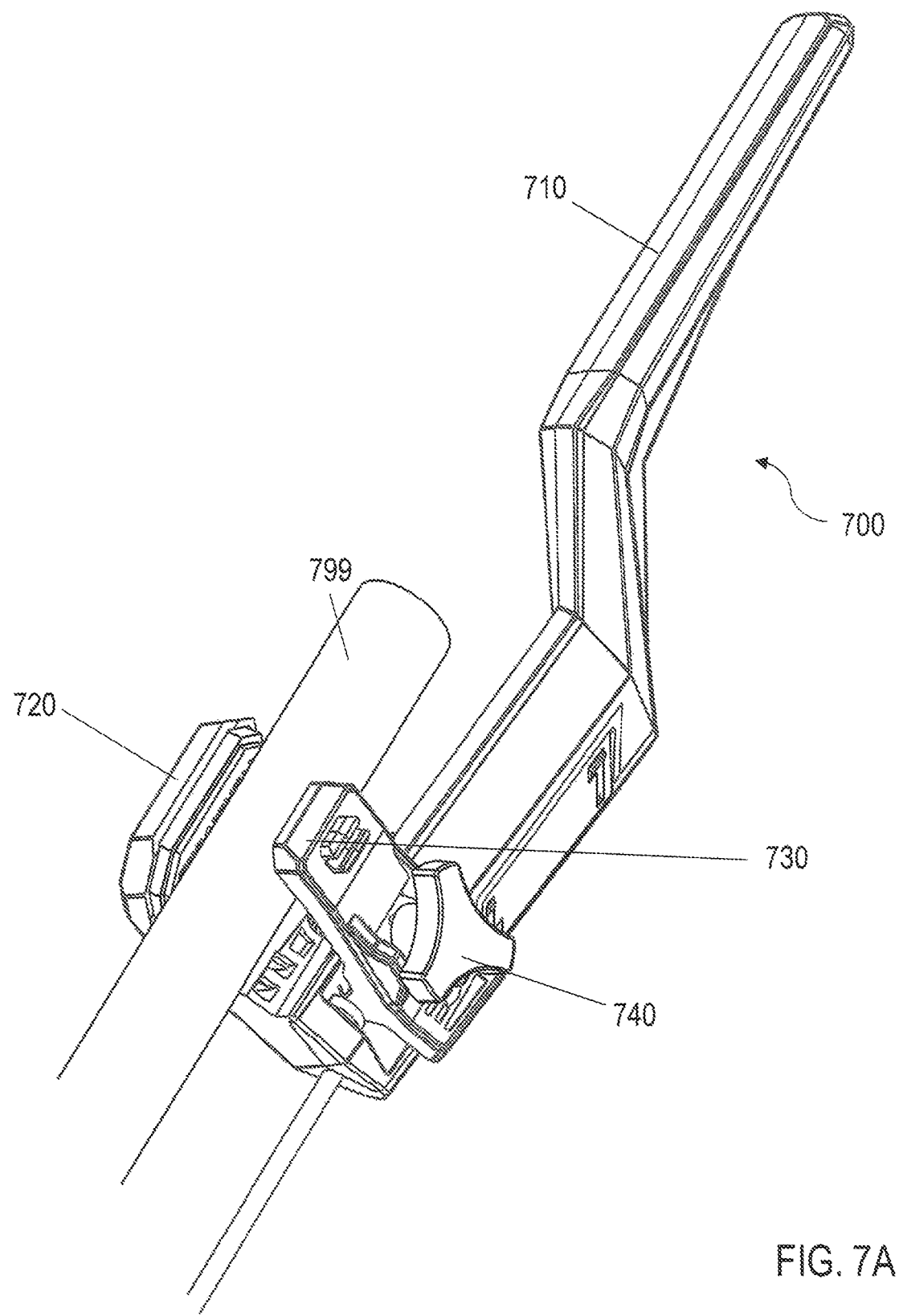
FIG. 7A depicts an apparatus for measuring velocities of projectiles, in accordance with a second embodiment.

Referring now to FIG. 7A, there is depicted an apparatus for measuring velocities of projectiles, in accordance with a second embodiment. As shown, a velocimeter 700 includes a sensor module 710, a stationary clamp arm 720 and a movable clamp arm 730. Both sensor module 710 and stationary clamp arm 720 are formed by the same molded plastic structure. In other words, sensor module 710 is an extension of the molded plastic structure that forms stationary clamp arm 720. Stationary clamp arm 720 and movable clamp arm 730 together forms a clamp, and movable clamp arm 730 can be moved in relation to stationary clamp arm 720. Velocimeter 700 is shown to be attached to a muzzle 799 of a firearm. Velocimeter 700 can be mounted onto muzzle 799 by placing stationary clamp arm 720 and movable clamp arm as 730 around muzzle 799 and tightening a thumb screw 740 to generate a clamping force to secure velocimeter 700 onto muzzle 799.

Figure 7B:
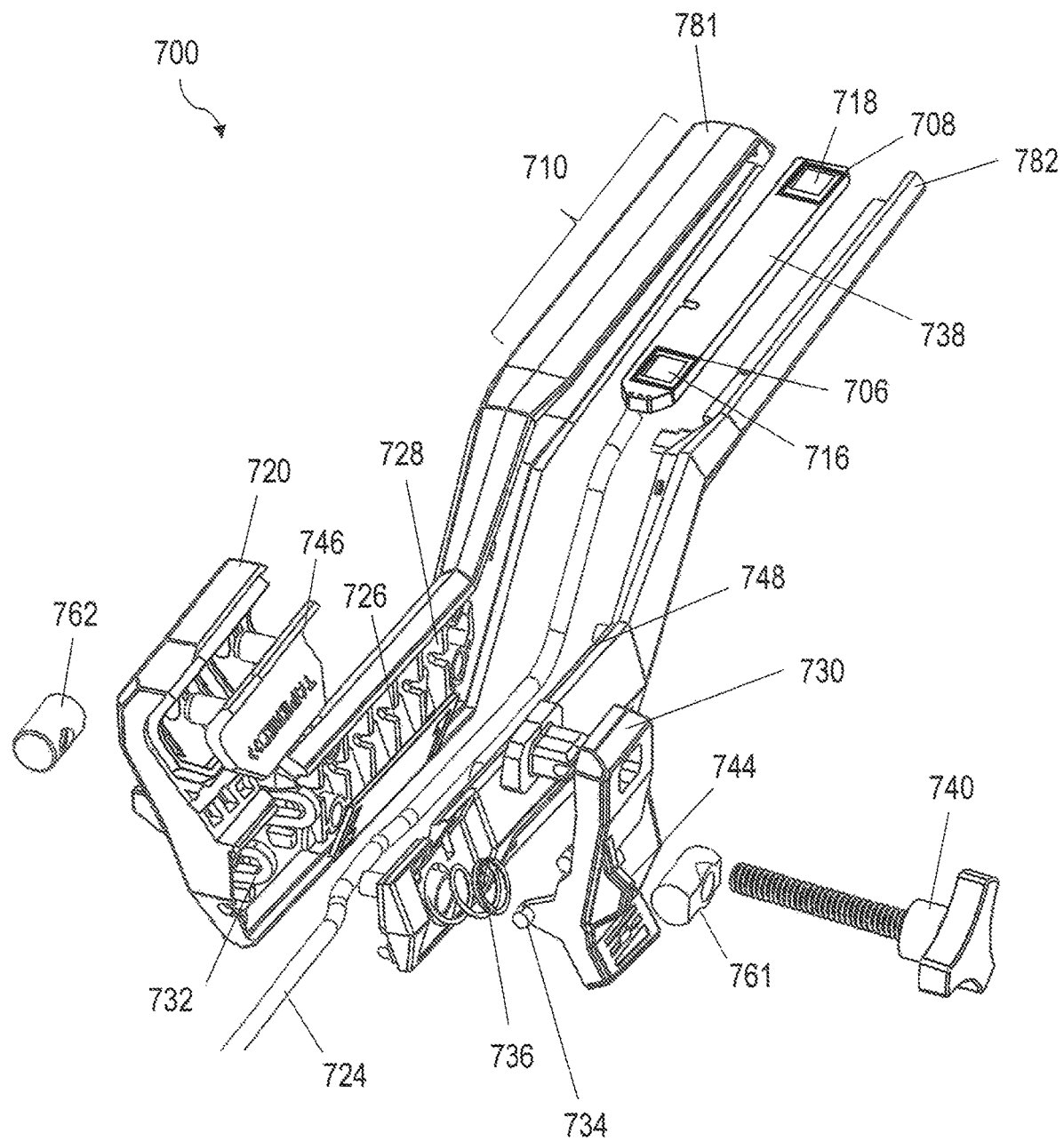
FIG. 7B is an exploded view of the apparatus from FIG. 7A.

FIG. 7B is an exploded view of velocimeter 700. As shown, velocimeter 700 includes molded plastic structure covers 781, 782. Covers 781, 782 forms the body of stationary clamp arm 720 and sensor module 700 that holds sensor coils 706 and 708. Sensor coils 706 and 708 can be formed by a single wire trace on a printed circuit board 738. Sensor coils 706, 708 function similar to sensor coils 106, 108 from FIG. 2. Magnets 716, 718 are embedded within circuit board 738 and have approximately the same thickness as circuit board 738. Magnets 716, 718 may be held in by a press fit, an adhesive, or by over-molding material over circuit board 738. Circuit board 738 is placed within a cavity within the molded plastic structure and may be secured using a press fit, adhesive, fasteners, or over-molding. The molded plastic structure may be over-molded on top of circuit board 738.

Covers 781, 782 include multiple ribs 728 that provide structural support to the molded plastic structure, for example, to reduce deflection from muzzle blasts. A wire lead 724 connects sensor coils 716, 718 to a controller, such as controller 116 from FIG. 1. Wire lead 724 is protected from muzzle blast by being routed inside covers 781, 782 before exiting out of velocimeter 700. Ribs 728 include channels 729 to form a path for wire lead 724 to pass through ribs 728 within covers 781, 782.

Loops 732 protrude through cover 781 when cover 781 is installed to form the molded plastic structure. Pivots 734 engage loops 732, to pivotally secure movable clamp 730 to cover 782 and to stationary clamp arm 720. Thus, movable clamp arm 730 may rotate around pivot 734 in relation to stationary clamp arm 720 to form a clamp. A spring 736 is held between cover 782 and movable clamp arm 730 to provide a small amount of clamping force to assist in the mounting of velocimeter 700 onto a muzzle.

Thumb screw 740 is utilized to apply a substantial force to secure velocimeter 700 onto the muzzle of a firearm. Thumb screw 740 extends through a hole in a swivel 761, a hole in movable clamp arm 730, and a hole in stationary clamp arm 720 before engaging a barrel nut 762. Tightening thumb screw 740 draws movable clamp arm 730 towards stationary clamp arm 720. Barrel nut 762 is cylindrical and fits in a curved recess in stationary clamp arm 720. Swivel 761 is also cylindrical and fits in a swivel recess 744, though swivel 761 has a planar portion for providing a bearing surface for the head of thumb screw 740 to rotate. As movable clamp arm 730 is being opened and closed, barrel nut 762 and swivel 761 rotate as needed within their respective recesses. This prevents binding and undesired forces in movable clamp arm 730.

Stationary clamp arm 720 includes a V-shaped stationary arm barrel pad 746 that contacts the muzzle of a firearm in at least two points around the circumference. Stationary arm barrel pad 746 may be made of a rigid or flexible material such as a silicone or urethane rubber. Stationary arm barrel pad 746 may be removably held onto stationary clamp arm 720 by means of one or more protrusions that fit into one or more corresponding recesses to generate a friction or interference fit.

Movable clamp arm 730 includes a movable arm barrel pad 748 designed to contact the muzzle in at least one point around the circumference. Like barrel pad 746, movable arm barrel pad 748 may be made of a rigid or flexible material such as silicone or urethane rubber. Movable arm barrel pad 748 may be removably held onto movable clamp arm 730 by means of one or more protrusions that fit into one or more corresponding recesses to generate a friction or interference fit.

Stationary arm barrel pad 746 maintains velocimeter 700 to be parallel to the bore of a firearm (and thus the bullet flight path). Movable arm barrel pad 748 holds the muzzle of the firearm firmly against stationary arm barrel pad 748.

Stationary clamp arm 720 and stationary arm barrel pad 746 are both tapered. Stationary arm barrel pad 746 can be adjusted by a user from a first orientation to a second orientation. In the first orientation, the tapers from stationary clamp arm 720 and stationary arm barrel pad 746 oppose each other, which helps sensor module 700 to be properly aligned on a straight (i.e., non-tapered) firearm barrel. In the second orientation, the tapers from stationary clamp arm 720 and stationary arm barrel pad 746 complement each other, which helps sensor module 700 to maintain proper alignment on a tapered firearm barrel.

III. Third Embodiment

Figure 8A:
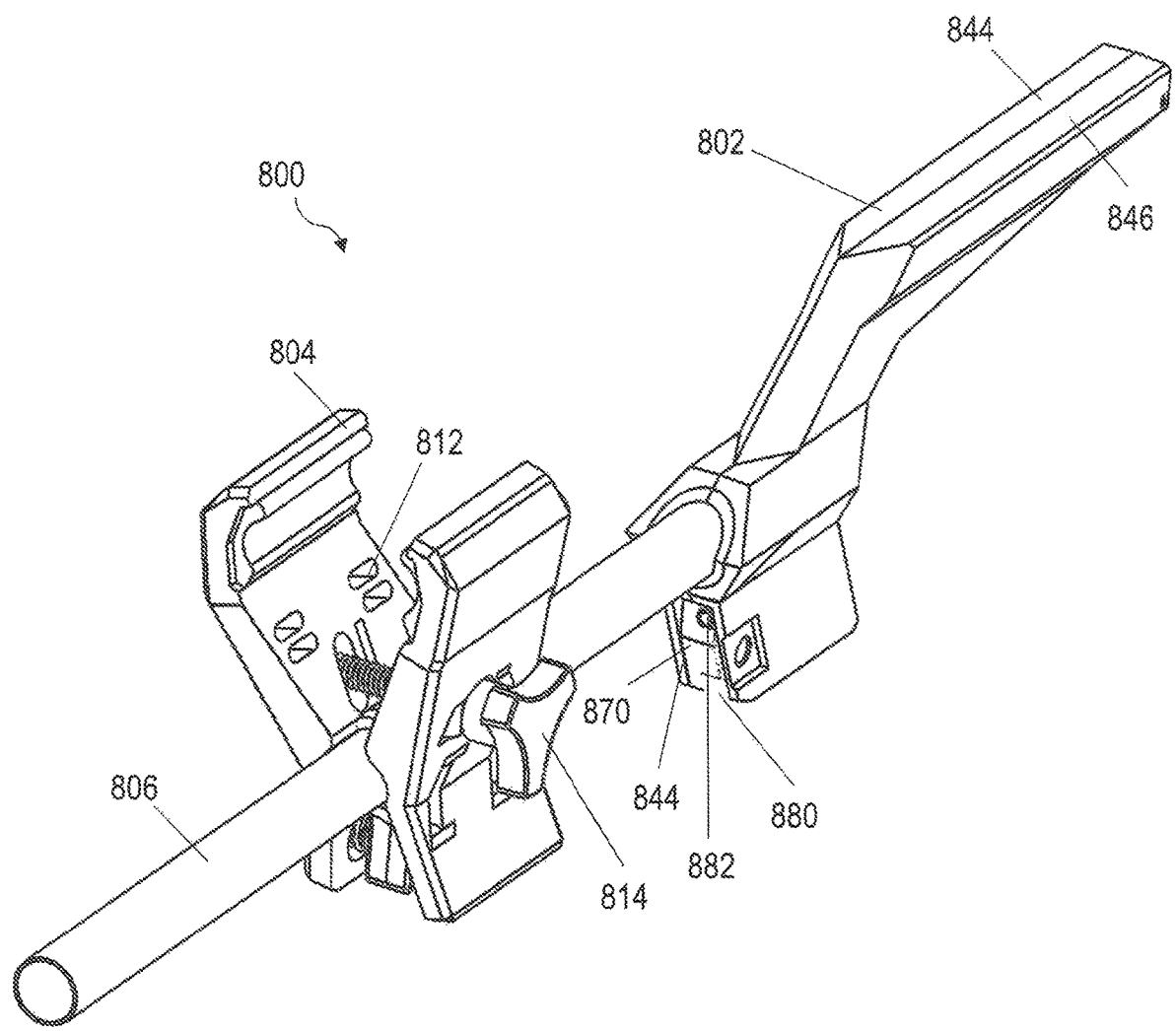
FIG. 8A depicts an apparatus for measuring velocities of projectiles, in accordance with a third embodiment.

With reference now to FIG. 8A, there is depicted an apparatus for measuring velocities of projectiles, in accordance with a third embodiment. As shown, a velocimeter 800 includes a sensor module 802 and a clamp 804 connected to each other via a cylindrical tube 806. Sensor module 802 is formed by a left cover 844 and a right cover 846 for protecting the components within sensor module 802. Clamp 803 is configured to grip a barrel or suppressor of a firearm. Tube 806 is removably connected to sensor module 802 and clamp 803. Tube 806 may be a single piece or may be made from multiple pieces attached end to end. Multiple pieces may be desirable to provide multiple tube length options to accommodate different firearms without tube 806 interfering with the operation of the firearm. Additionally, multiple tube sections allows for more compact storage of velocimeter 800. The tubes may be threaded on one or both ends and may thread into one another or may connect through the use of an intermediary connector between two tube sections. Clamp 804 can be positioned anywhere axially along tube 806. This allows a user to configure velocimeter 800 for different firearms and applications.

Figure 8B:
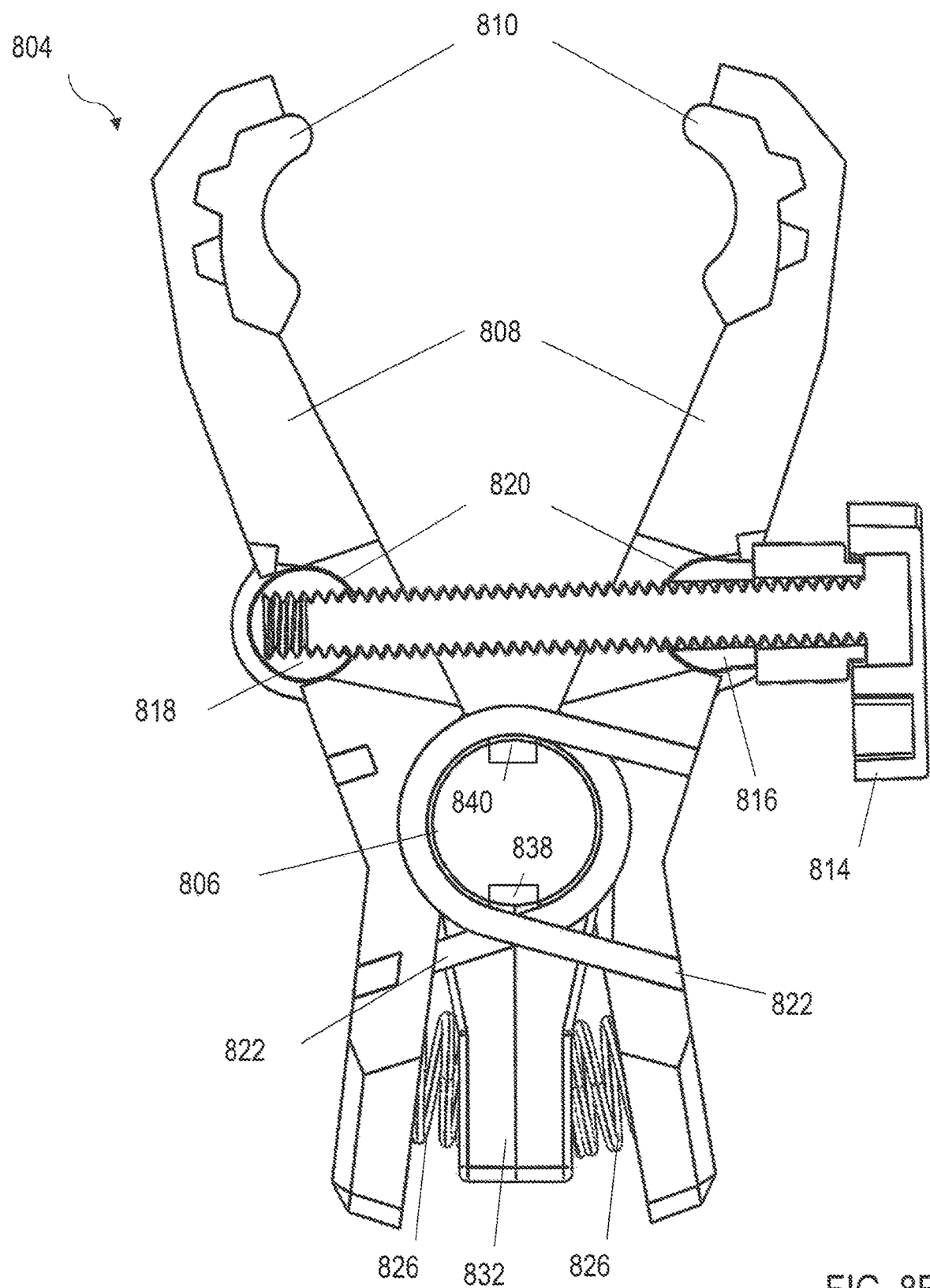
FIG. 8B is a sectional view of a clamp and tube of the apparatus from FIG. 8A.
Figure 8C:
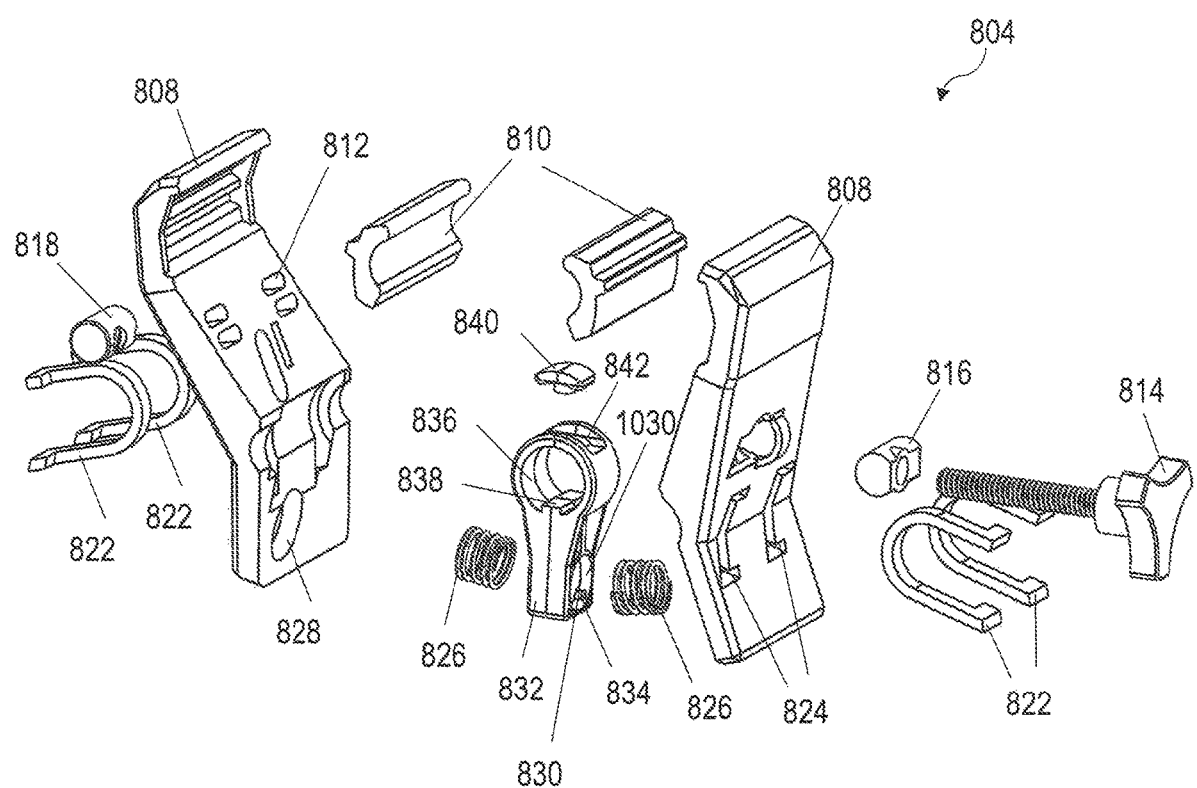
FIG. 8C is an exploded view of the clamp arm from FIG. 8B.

FIG. 8B is a cross-sectional view of clamp 804 and tube 806. FIG. 8C is an exploded view of clamp 804. As shown in FIGS. 8B-8C, clamp 804 includes two movable clamp arms 808 that pivot around tube 806, opening and closing symmetrically when installing on a firearm. The symmetrical action keeps sensor module 802 aligned with the bullet flight path during installation, which makes mounting quick and simple. Clamp arms 808 may interface tube 806 via a semicircular surface, a V-shaped surface, a polygonal surface, or other appropriate geometry to ensure substantially parallel alignment between the firearm central bore and tube 806 and ultimately sensors inside sensor module 802.

Barrel pads 810 are attached to each movable clamp arm 808 and are configured to engage a portion of a firearm to hold velocimeter 800 onto the firearm. Barrel pads 810 may be removable from clamp arms 808, allowing a user to select a set of barrel pads for a particular application. Barrel pads 810 may be formed of rigid or flexible materials and may come in a variety of sizes and shapes such as semicircular, ovoid, polygonal, tapered, etc. or made to fit M-LOK, KeyMod, Picatinny rails, or the like. Barrel pads 810 in the embodiment shown in FIG. 8B are semicircular and made of a flexible material that allows the radius to expand to fit the radius of a barrel or suppressor. A flexible material, such as silicon rubber or urethane s rubber, may be used to enhance grip on a firearm due to the coefficient of friction being higher than with a rigid material. Flexible barrel pads may also help mitigate forces caused by recoil and muzzle blast. Barrel pads 810 may fit into clamp arms 808 in more than one position to allow clamp arms 808 to accommodate a wider range of firearms. For example, barrel pads 810 can be flipped vertically to produce a different clamp geometry or a different barrel offset distance than in the original configuration.

Jaw receivers 812 (see FIG. 8A) on clamp 804 are a pair of slots intended to hold an alternative jaw insert configured for engaging the firearm, such as when the positioning or configuration of barrel pads 810 is inappropriate for holding velocimeter 800 on a firearm at the required spacing between sensor module 802 and the bullet flight path.

Thumb screw 814 is positioned between the clamp pivot point (i.e., tube 806) and barrel pad 810/jaw receiver 812. When tightened, thumb screw 814 applies a force to both clamp arms 808, which in turn clamp onto a firearm (via barrel pads 810 or jaw receivers 812). Thumb screw 814 additionally provides a clamping force onto tube 806 where tube 806 contacts movable clamp arms 808. Swivel 816 and barrel nut 818 are both cylindrical and fit in a cylindrically-shaped recess 820 in each clamp arm 808. Swivel 816 and barrel nut 818 may rotate with respect to recesses 820 as movable clamp arms 808 are opened and closed. Thus, thumb screw 814 can apply a compressive clamping force throughout a broad range of clamp arm positions. Additionally, swivel 816 has a flat portion to provide a bearing surface for thumb screw 814 to rotate during tightening and loosening. Swivel 816 and barrel nut 818 are similarly sized and may be reversed, allowing the user to flip thumb screw 814 from one side to the other.

When not clamped on a firearm, clamp 804 is held onto tube 806 by axle straps 822. Axle straps 822 fit through holes 824 in movable clamp arms 808 and encircle tube 806 installed within.

Two springs 826 provide a small amount of clamping force on the firearm to aid in installation, specifically by holding velocimeter 800 onto the firearm while thumbscrew 814 is being tightened. Installation and removal of velocimeter 800 can therefore be performed with a one hand. Springs 826 fit into spring recesses 828 of clamp 804 and spring recesses 830 of ventral fin 832. Spring recesses 828, 830 are cylindrical depressions that hold springs 826 from lateral movement. Spring recesses 828 may include a spring catch 834, which is a protrusion designed to prevent spring 826 from falling out of spring recess 830 once inserted.

Ventral fin 832 has a central bore 836 designed to receive tube 806. Key 838 in bore 836 is designed to fit within a corresponding slot in the bottom of tube 806 to restrict rotational movement of ventral fin 832 with respect to tube 806. After tube 806 has been inserted into bore 836 of ventral fin 832 and placed in the desired position, a ventral fin lock 840 is inserted into a lock recess 842 in the body of ventral fin 832. Ventral fin lock 840 penetrates a corresponding hole in the top of tube 806, preventing axial movement of tube 806 within central bore 836. Ventral fin lock 840 is prevented from falling out of lock recess 842 by being entrapped by movable clamp arms 808 when clamp 804 is fully assembled. Thus, ventral fin 832 and ventral fin lock 840 restrict movement of tube 806 in all directions. Sensor module 802 is similarly removably locked onto tube 806, as will be explained infra. Therefore, sensor module 802 and ventral fin 832 are rotationally and axially locked together to form a complete unit.

Springs 826, clamp arms 808, and ventral fin 832 are designed to keep tube 806 and sensor module 802 in a preferred orientation. In one embodiment, springs 826 are identical and springs 826 sit in equal distance gaps between ventral fin 832 and clamp arm 808. As clamp arms 808 are opened and closed, the springs between each of clamp arm 808 and ventral fin 832 keep ventral fin 832 centered between two clamp arms 805 due to balanced forces between the springs. Additionally, the thumb screw, swivel, and barrel nut are designed to apply approximately the same force on each clamp arm. Thus, as clamp is opened, placed over the firearm, and tightened, tube 806 and sensor module 802 stay aligned with the bullet flight path without the user needing to manually adjust the sensor module position.

Axle straps 822 trap ventral fin 832, preventing axial movement of clamp arms 808 with respect to ventral fin 832. The result is that the only relative movement in the entire velocimeter 800 is the symmetrical opening and closing of clamp arms 808. After thumb screw 814 has been tightened down, clamp arm movement is also prevented and therefore the entire velocimeter 800 acts as rigid structure attached to a firearm. The geometry of clamp 804 is such that opening and closing clamp arms 808 to accommodate various firearm sizes produces small changes in the distance from the central bore of the firearm, therefore placing sensor module 802 at an appropriate sensing distance for a wide range of firearm calibers and barrel or suppressor diameters.

Figure 8D:
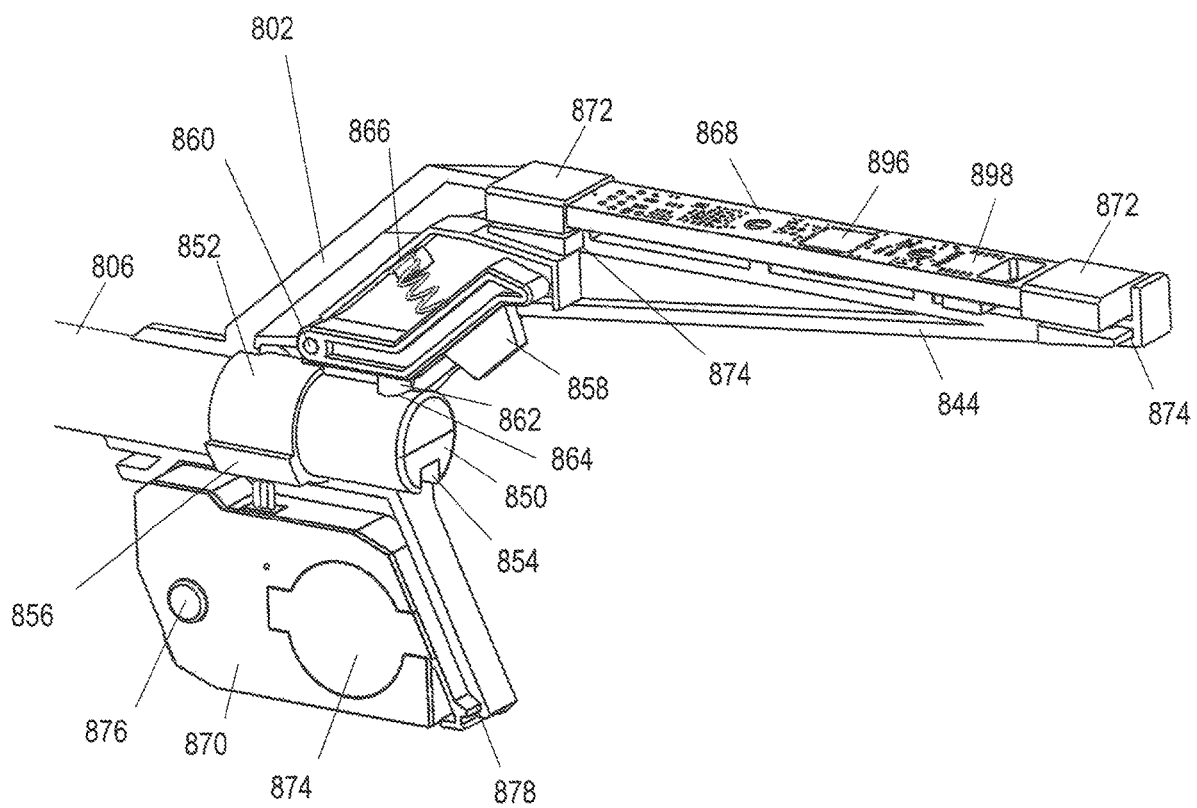
FIG. 8D is a cutaway view of the sensor module of the apparatus from FIG. 8A.

FIG. 8D shows a cutaway view of sensor module 802 attaching to tube 806. As shown, sensor module 802 includes a circuit board 868 that houses two sensor coils 896, 898 formed by a single trace in a printed circuit board 868. Sensor coils 896, 898 function similar to sensor coils 106, 108 from FIG. 4. Sensor coils 896, 898 are displaced at a tightly-controlled spacing along the length of circuit board 868. Each of sensor coils includes a magnet recessed inside within circuit board 868. Endcaps 872 serve to hold circuit board 868 in place, and may help retain the magnets as well as isolate circuit board 868 from vibration and bending. To accomplish this, endcaps 872 may be made of a semi-rigid or elastomeric material such as rubber.

A sensor module adapter 850 may be attached to tube 806 to provide features for securing sensor module 802 to tube 806. An alignment ring 852 is a cylindrical piece designed to fit over tube 806 and sensor module adapter 850 and intended for restricting the rotation of sensor module 802 around tube 806. A key formed within the inside diameter of the ring is designed to fit within keyway 854 on the bottom of sensor module adapter 850. External features of alignment ring 852, such as key 856, interface with features in the left or right body to prevent rotation. Keyway 854 of sensor module adapter 850 is open on the end to allow sensor module 802 to slide onto the end of sensor module adapter 850 and tube 806.

A locking lever 858 provides a means to quickly and easily attach and remove sensor module 802. Locking lever 858 pivots around a pin 860. A peg 862 of locking lever 858 is a cylindrical protrusion that is designed to fit in hole 864 in sensor module adapter 850. Additional holes may be provided to allow axial adjustment of sensor module 802. A compression spring 866 holds peg 862 in hole 864. Locking lever 858 extends outside of cover 844 (from FIG. 8A) to allow a user to manipulate locking lever 858. Pressing on locking lever 858 will cause spring 866 to compress and locking lever 858 to pivot, until peg clears hole 864. Sensor module 802 may then be attached, removed, or adjusted. Releasing locking lever 858 allows spring 866 to push peg 862 into hole 864. Locking lever 858, together with the key in alignment ring 852 and keyway 854, secure sensor module 802 to tube 806.

Additional electronics may be contained within an electronics module 870 that houses a circuit board (not shown) having electronics necessary for operation, such as the electronics within controller 116 from FIG. 4, as well as a power source for sensor module 802. The circuit board within electronics module 870 may receive signals or data from circuit board 868. The wire between circuit board 868 and electronics module 870 may be routed behind alignment ring 852. Alignment ring 852 thus performs its secondary function of preventing the wires from falling into the tube pathway.

Electronics module 870 may house a power source such as a replaceable coin cell battery. A battery cover 874 made of a flexible material such as rubber provides access to the battery when open and prevents dirt and liquid ingress when closed. A button cap 876, which may be formed with battery cover 874, allows a user to operate a button within electronics module 870 to perform various functions such as cycling power, wireless pairing, and mode selection. Button cap 876 also provides a pivot point for electronics module 870 to allow access to change the battery. A latch 878 formed into the body of electronics module 870 holds battery cover 874 closed. To install or remove the battery, a user presses on latch 878 to release electronics module 870. Battery cover 874 may then be opened, the battery installed or removed, battery cover 874 closed, and the module pushed back into place until latch 878 locks electronics module 870 in place.

An indicator light (not shown) within electronics module 870 is configured to shine through a translucent or transparent window to inform a user of the status of sensor module 802. Sensor module 802 may communicate wirelessly with a controller such as a purpose-built display unit or to a standard commercial electronic device such as a computer, tablet, or smart phone. Sensor module 802 can be connected to an external controller via a jack 882 (see FIG. 8A).

The external controller may also include an external trigger output for triggering another device, such as a high-speed camera. Such an output may be wired or wireless, including Bluetooth, BLE, or infrared. Fiber optics may be used to transfer data all or a portion of the distance between sensor module 802 and the external controller. Wireless power transfer, (e.g., inductive coupling, capacitive coupling, magneto dynamic coupling, microwaves, or light waves) may be used to transfer power to/from any of: an external power supply, the sensor module, or the controller. Data may also be sent between devices (e.g., a sensor module and controller) using a wireless power transfer method.

A. Primary Attachment Module

If a firearm already comes with a Picatinny-style rail, velocimeter 800 can be secured to the firearm via an attachment module instead of using clamp 804.

Figure 9:
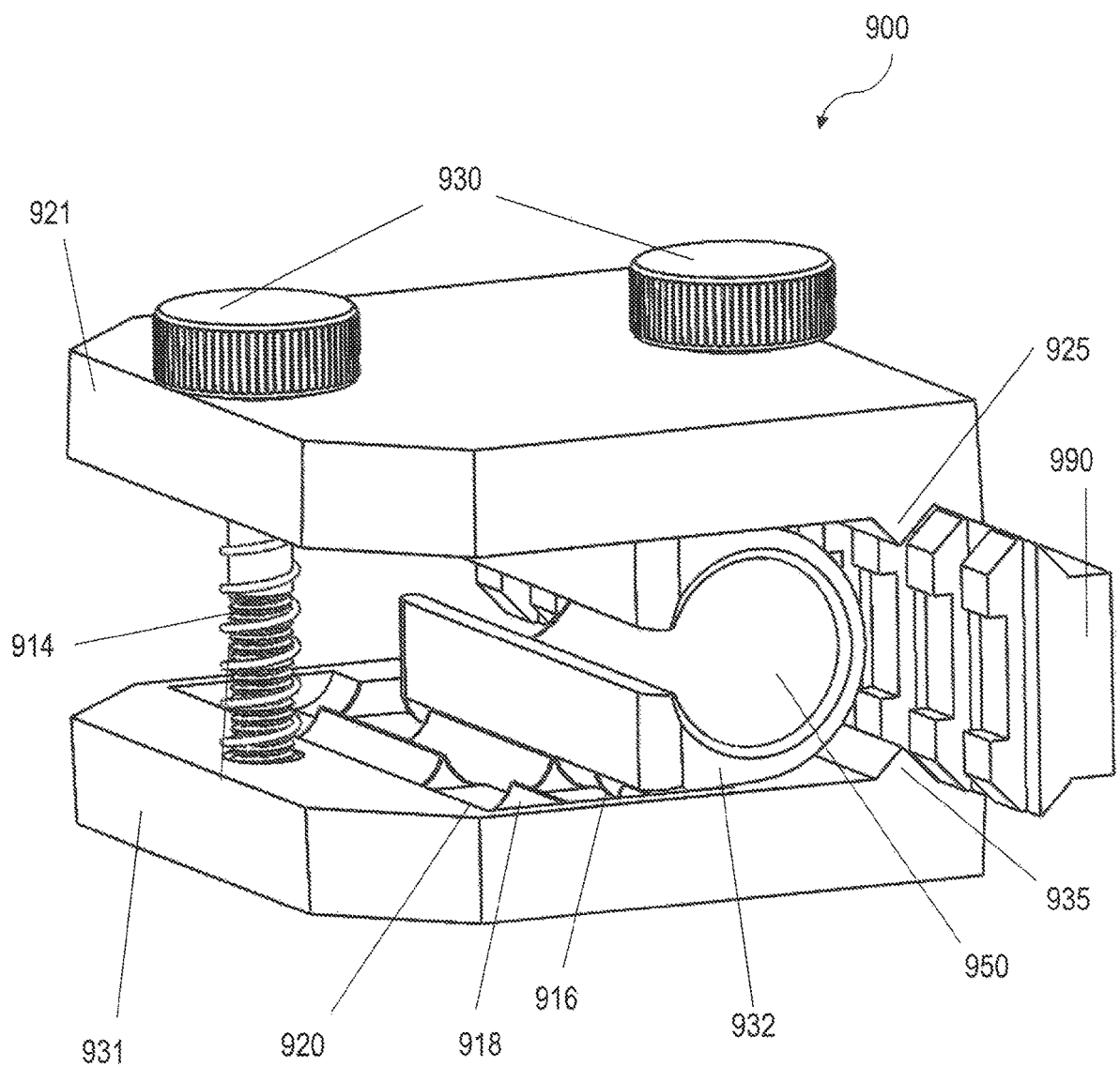
FIG. 9 depicts a first attachment module for the apparatus from FIG. 8A.

Referring now to FIG. 9, there is depicted an attachment module for velocimeter 800. As shown, an attachment module 900 includes a first plate 921 and a second plate 931 connected to each other via a tube collar 932 having a bore 950 in the center for receiving tube (from FIG. 8A). Plates 921 and 931 also include V-shaped channels 925 and 935, respectively, for receiving a Picatinny-style rail 990 of a firearm (not shown).

In addition, thumbs screws 930 provide a clamping force between plates 921 and 931. Thumb screws 930 pass through clearance holes in plate 921 and thread into plate 931. Threaded inserts may be placed within plate 931 and used to provide stronger threads than may be obtained by plate 931, such as when plate 931 is made of a plastic or a soft metal such as aluminum. Spring 914 spreads plates 921 and 931 apart as thumb screws 930 are loosened, providing stability and preventing binding during installation and use.

Installing attachment module 900 involves loosening or removing one or both thumb screws 930 and positioning plates 921 and 931 around rail 990 at a desired location. Tube 806 (from FIG. 8A) can be inserted into bore 950. Thumb screws 930 can be tightened to secure attachment module 900 onto rail 990 and tube 806. One or both thumb screws 930 may be loosened to permit axial and rotational adjustment of tube 806 or to adjust the position of collar 932 without removing attachment module 900 from rail 990.

Collar 932 has cylindrical ears 916 that fit into corresponding longitudinal grooves 918 in plates 921 and 931. Cutouts 920 between longitudinal grooves 918 allow for lateral movement of collar 932 at certain axial positions. Thus, a user may adjust the lateral position of collar 932 by sliding collar 932 axially until ears 916 align with cutouts 920. Collar 932 may then be moved laterally into another longitudinal groove. Sliding collar 932 axially until ears 916 are no longer lined up with any cutouts 920 secures the lateral position of collar 932. To improve the ease of switching the lateral position of collar 932, cutouts 920 may be offset axially between neighboring grooves, such that at a given axial position of collar 932, only two longitudinal grooves are accessible. To move to a third groove, further axial movement is required. Thus, collar 932 moves in a Z-shaped pattern when moving two or more longitudinal grooves. After receiving tube 806 at bore 950, velocimeter 800 can be utilized with a firearm already comes with a Picatinny-style rail.

B. Secondary Attachment Modules

If a firearm already comes with a dovetail mount (which is also referred to as an "arca" mount that is based on Arca-Swiss style mounts commonly used in camera tripods), velocimeter 800 can be secured to the firearm via a different attachment module instead of using clamp 804.

Figure 10:
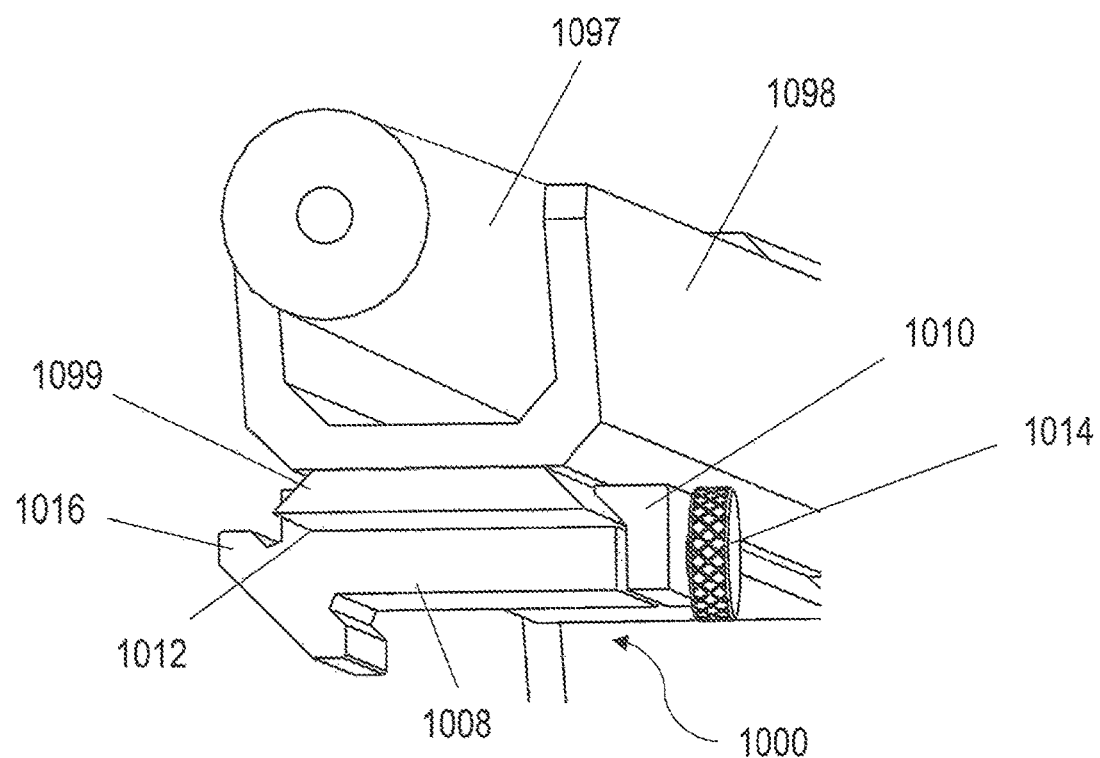
FIG. 10 depicts a second attachment module for the first attachment module from FIG. 9, according to a first embodiment.

With reference now to FIG. 10, there is depicted an attachment module for attachment module 900. In this example, an attachment module 1000 is attached to a dovetail 1099 that is mounted on a stock 1098 of a firearm 1097. As shown, attachment module 1000 includes a main body 1008 and a clamp body 1010. A groove 1012 in main body 1008 is configured to engage with the beveled side of dovetail 1099 while clamp body 1010 is configured to engage the opposing side of dovetail 1099. A thumb screw 1014 passes through a clearance hole in clamp body 1010 and engages threads in main body 1008. Tightening thumb screw 1014 causes main body 1008 and clamp body 1010 to be drawn towards each other, until attachment module 1000 is clamped tightly against dovetail 1099. Attachment module 1000 also includes a picatinny-style rail portion 1016. Picatinny-style rail portion 1016 allows attachment module 1000 to be attached to attachment module 900 from FIG. 9 via channels 925 and 935 of attachment module 900.

Figure 11:
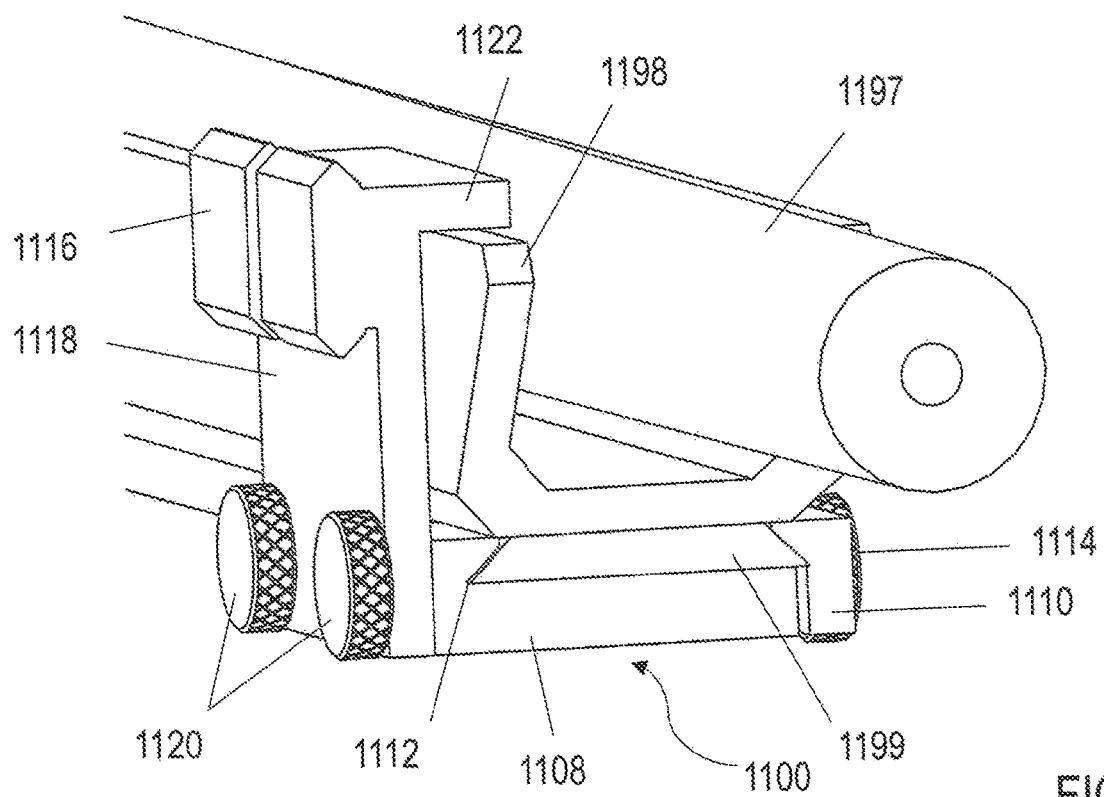
FIG. 11 depicts a second attachment module for the first attachment module from FIG. 9, according to a second embodiment.

Referring now to FIG. 11, there is depicted an attachment module for attachment module 900, according to an alternative embodiment. In this example, an attachment module 1100 is attached to a dovetail 1199 that is mounted on a stock 1198 of a firearm 1197. As shown, attachment module 1100 includes a main body 1108 and a clamp body 1110. A as groove 1112 in main body 1108 is configured to engage with the beveled side of dovetail 1199 while clamp body 1110 is configured to engage the opposing side of dovetail 1199. A thumbscrew 1114 passes through a clearance hole in clamp body 1110 and engages threads in main body 1108. Tightening screw 1114 causes main body 1108 and clamp body 1110 to be drawn towards each other, until attachment module 1100 is clamped tightly against dovetail 1199.

Attachment module 1100 also includes an adapter body 1118 attached to main body 1108. Thumbscrews 1120 pass through holes in adapter body 1118 and into threaded holes in main body 1108. Adapter body 1118 includes multiple elongated holes for thumbscrews 1120 to allow for adjustability. Setup of attachment module 1100 may include loosening one or both thumbscrews 1120, adjusting adapter body 1118 to a desired position, and tightening thumbscrews 1120 to lock adapter body 1118 in a desired position. Adapter body 1118 includes an alignment section 1122 designed to engage a portion of firearm 1197 to aid in alignment. In the present embodiment, alignment section 1122 is an L-shaped protrusion from adapter body 1118. Alignment section 1122 may be pressed against the top of stock 1198 while tightening thumbscrews 1120 to align a Picatinny-style rail portion 1116 parallel with the bore of firearm 1197. Picatinny-style rail portion 1116 allows attachment module 1100 to be attached to attachment module 900 from FIG. 9 via channels 925 and 935 of attachment module 900.

If a firearm has a wood or metal stock running substantially parallel with the barrel, velocimeter 800 can be secured to the firearm via another attachment module instead of using clamp 804.

Figure 12:
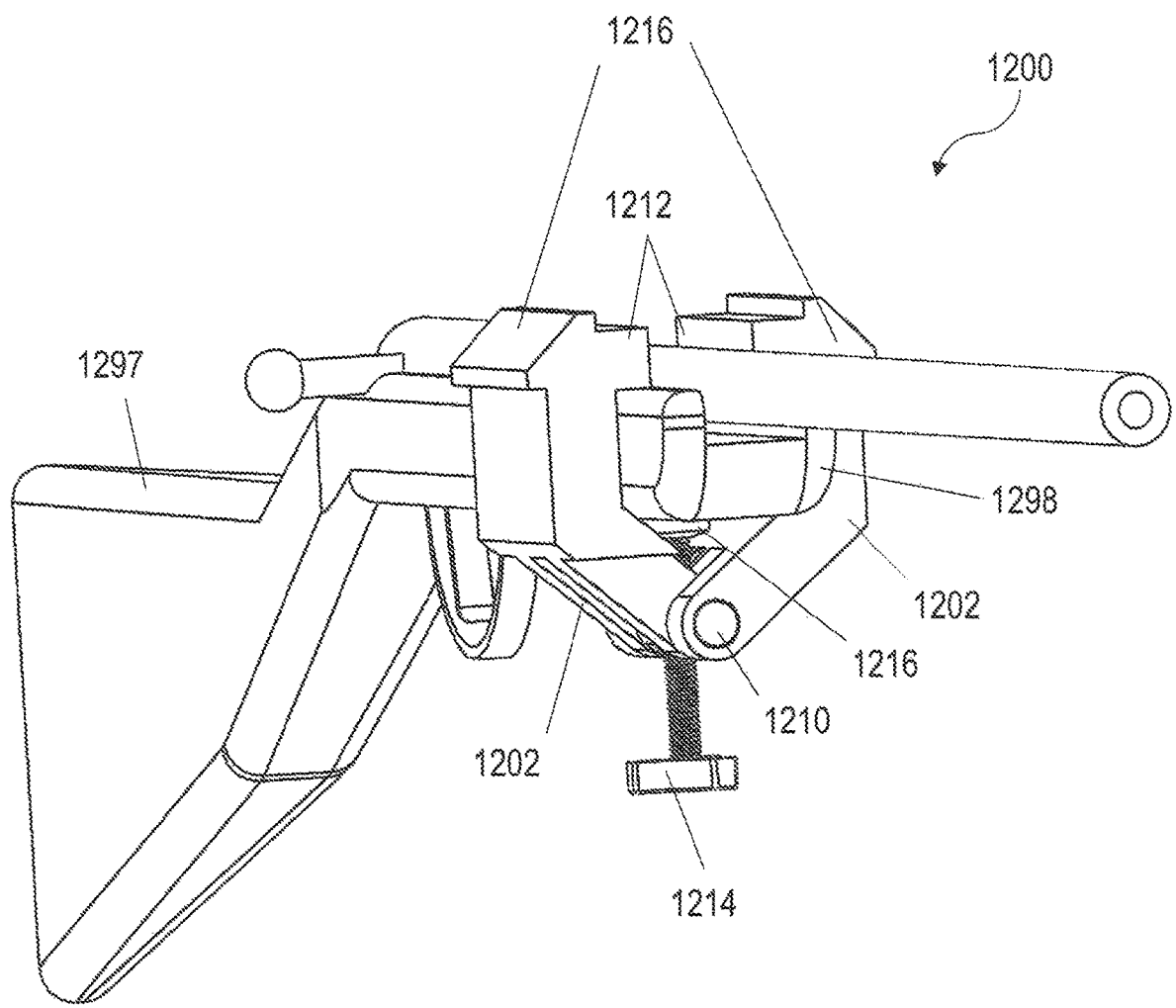
FIG. 12 depicts a second attachment module for the first attachment module from FIG. 9, according to a third embodiment.

With reference now to FIG. 12, there is depicted an attachment module for n velocimeter 800, according to an another alternative embodiment. In this example, an attachment module 1200 is attached to a stock 1298 of a firearm 1297. As shown, attachment module 1200 includes two clamp arms 1202 having a set of interlocking fingers through which pin 1210 passes through. Pin 1210 forms a hinge that allows clamp arms 1202 to independently pivot around pin 1210 to facilitate installation and removal of attachment module 1200 on a firearm as well as allow adjustment for varying stock widths. A torsion spring may be used to push clamp arms 1202 together to aid in installation of attachment as module 1200. Clamp arms 1202 are shaped to fit around stock 1298 of firearm 1297 and have alignment sections 1212 that are L-shaped sections extending from each stock clamp and designed to engage the top surface of stock 1298 on either side of firearm 1297.

A thumbscrew 1214 passes through a threaded hole in pin 1210 to lock attachment module 1200 to stock 1298. At the end of thumbscrew 1214, a swivel pad 1226 is attached, which allows thumbscrew 1214 to rotate with pad 1226 remaining stationary with respect to firearm 1297, as well as accommodating tapers or curves of stock 1298.

A covering, such as rubber, foam, fabric, etc. may be attached to swivel pad 1226 and any surface that may touch firearm 1297, such as the underside of alignment sections 1212 to enhance the stock clamp's grip on firearm 1297 or to protect firearm 1297 from being damaged by clamp arms 1202.

A set of Picatinny-style rail portions 1216 allows attachment module 1200 to be attached to attachment module 900 from FIG. 9 via channels 925 and 935 of attachment module 900.

C. Inline Sensor Modules

Instead of mounting on the outside of a barrel or suppressor of a firearm, an inline sensor module is designed to thread onto the barrel of a firearm.

Figure 13A:
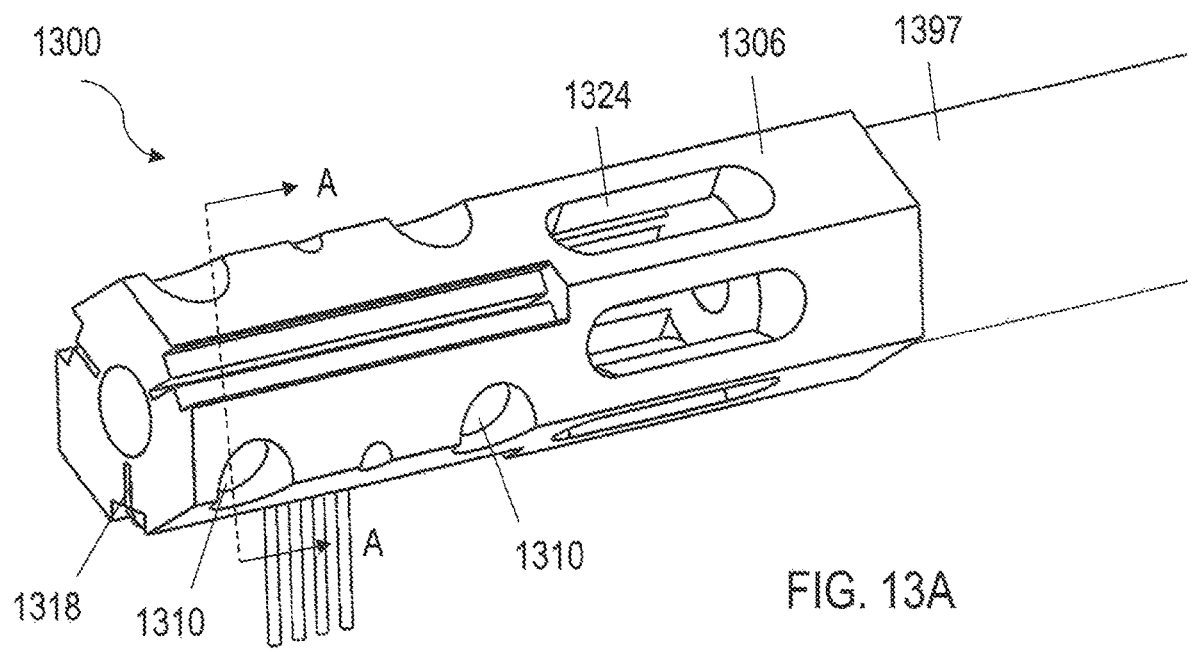
FIGS. 13A-13C show an inline sensor module.
Figure 13B:
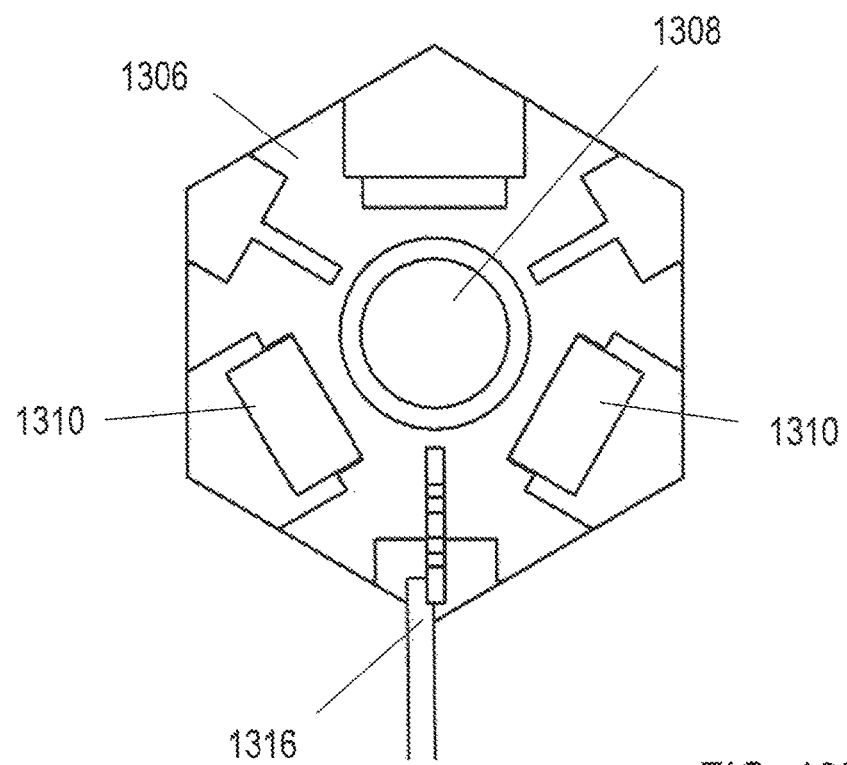
Figure 13C:
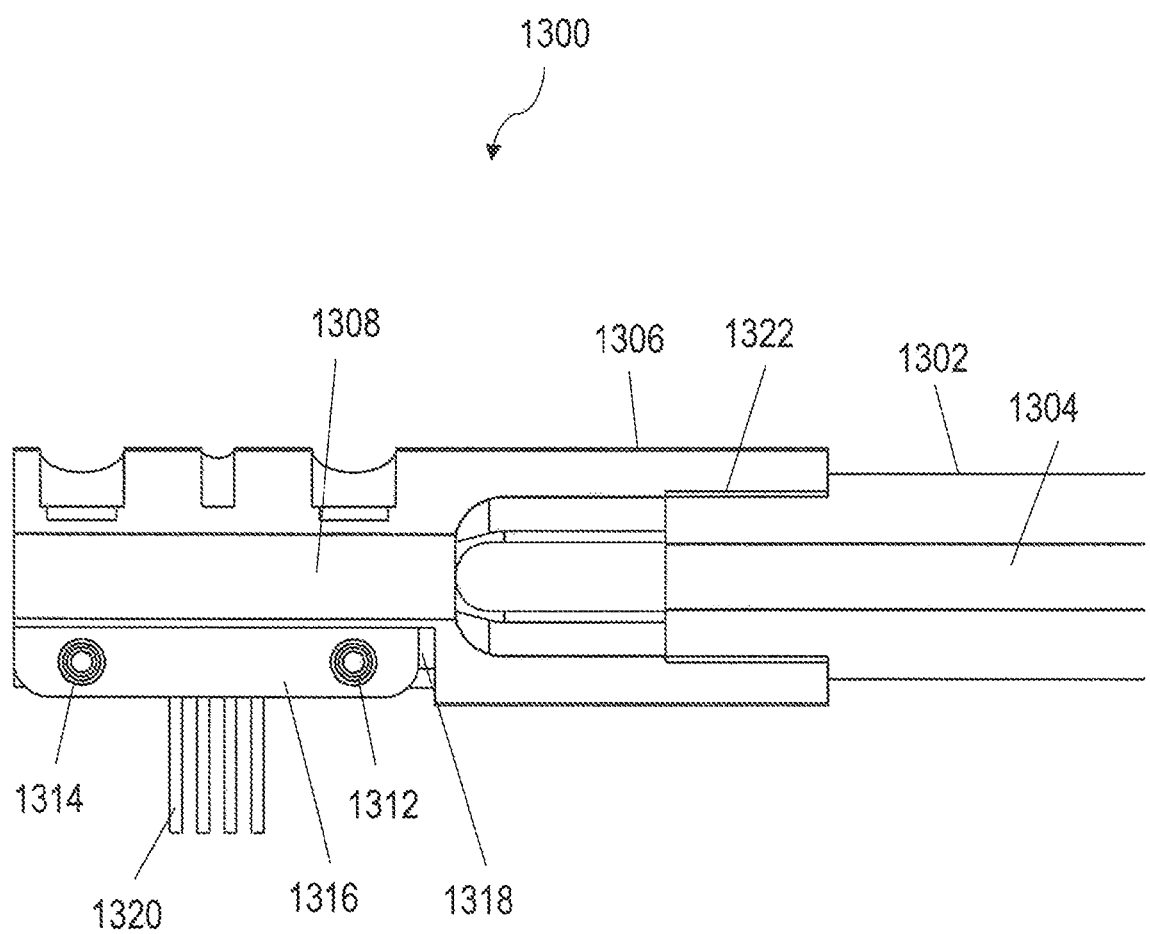

FIG. 13A depicts an inline sensor module 1300 mounted on a gun barrel 1397. FIG. 13B shows a cross-sectional view of sensor module 1300 taken along line A-A. FIG. 13C is a cross-sectional view of sensor module 1300 taken along the longitudinal axis of a bore. As shown, sensor module 1300 includes a body 1306 having a hexagonal cross-section and a bore 1308 extending axially through body 1306. Bore 1308 is configured such that a bullet from the firearm may pass therethrough. Bore 1308 is shown as a cylindrical bore but may be any shape and need not be fully enclosed. Bore 1308 may be partially open at any point along the length of body 1306 to let muzzle blast escape.

Magnets 1310 provide a magnetic field that passes through bore 1308 as well as a sensor coil 1312 and a sensor coil 1314 on a circuit board 1316. Circuit board 1316 sits in a recessed cavity 1318 within body 1306. Recessed cavity 1318 is configured to hold circuit board 1316 in place and to allow sensor coils 1312 and 1314 to be as close to bore 1308 as possible. Recessed cavity 1318 does not extend into cavity 1308 so as to protect circuit board 1316 from the conditions within bore 1308 when a bullet is fired from the firearm. Leads 1320 electrically connect sensor coils 1312 and 1314 to a controller (not shown) to process signals generated by sensor coils 1312 and 1314.

During operation, a bullet (which does not need to be ferromagnetic) fired from the firearm travels down bore 1304 of the firearm towards sensor module 1300. The bullet exits bore 1304 of the firearm and continues through bore 1308 of sensor module 1300. As the bullet passes through the magnetic field generated by magnets 1310, the bullet disrupts the magnetic field, including the field passing through sensor coils 1312 and 1314. The disrupted magnetic field causes sensor coils 1312 and 1314 to produce a signal that travel through leads 1320 to a controller to determine the velocity.

Sensor coils 1312 and 1314 may be formed by any means, including coiled wire or traces within circuit board 1316. Sensor coils 1312 and 1314 may be formed by one metal trace within circuit board 1316. Body 1306 may be made of any material, such as metals, carbon fiber, composites, or natural materials. Non-magnetic metals with high magnetic permeability and low electrical conductivity, such as titanium or 316 stainless steel are preferred because they allow the magnetic field to pass into the bore but discourage eddy currents which distort the signal. It is also possible to construct an inline sensor module out of a series of thin metallic plates with insulating layers between each plate (e.g., steel and fiber glass). The insulating layers reduce the eddy currents in the metallic plates, thus reducing distortion of the sensor signal.

Sensor module 1300 is attached to barrel 1397 by threading onto external threads 1322 of barrel 1397; however, other suitable methods of attachment may be used. Slots 1324 in body 1306 release blast as the bullet exits bore 1304 of the firearm and therefore sensor module may also act as a flash hider. Sensor module 1300 may be integrated with other muzzle devices such as a muzzle brake or suppressor.

Figure 14A:
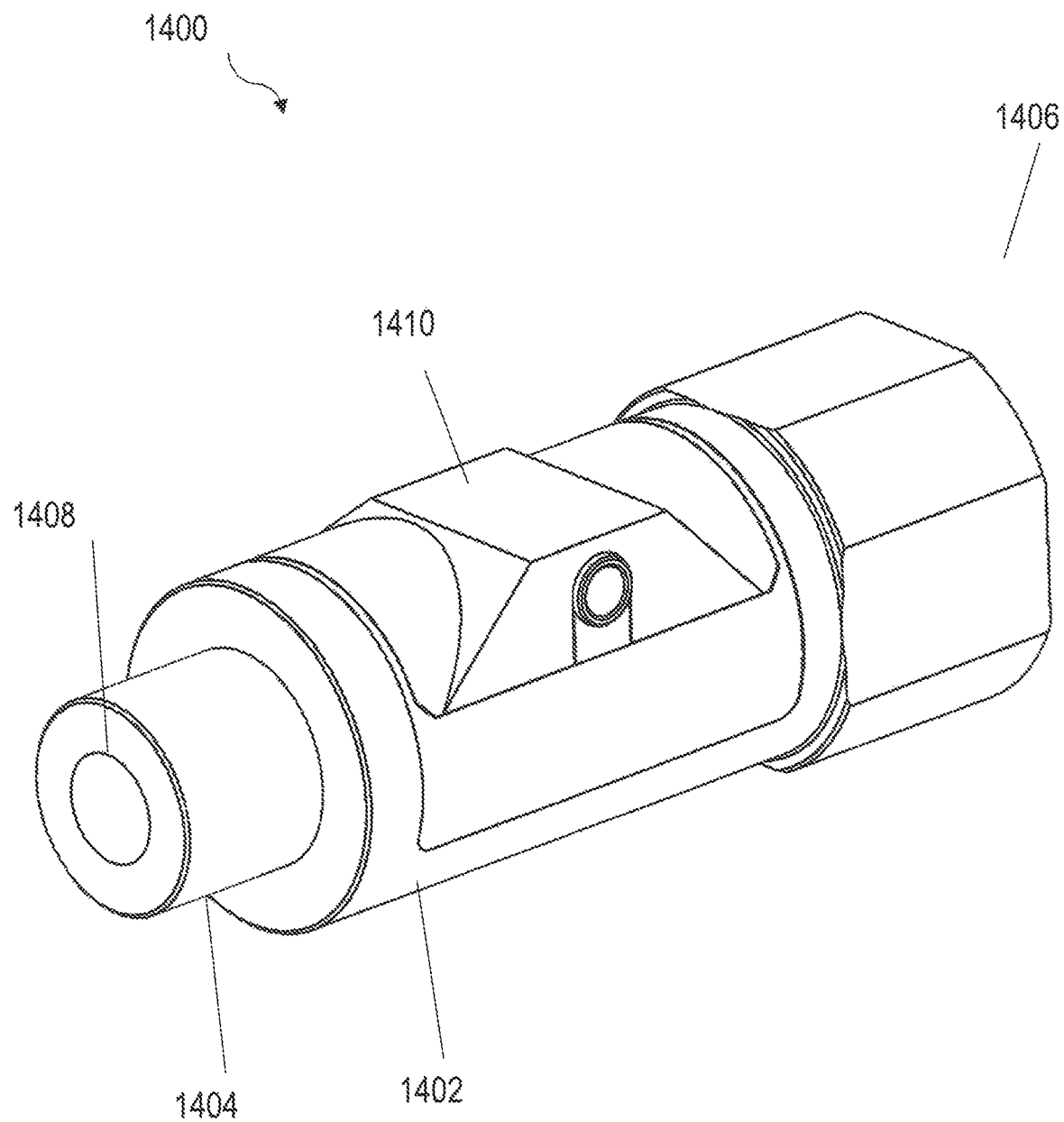
FIGS. 14A-14B depict an inline sensor module, according to an alternative embodiment.
Figure 14B:
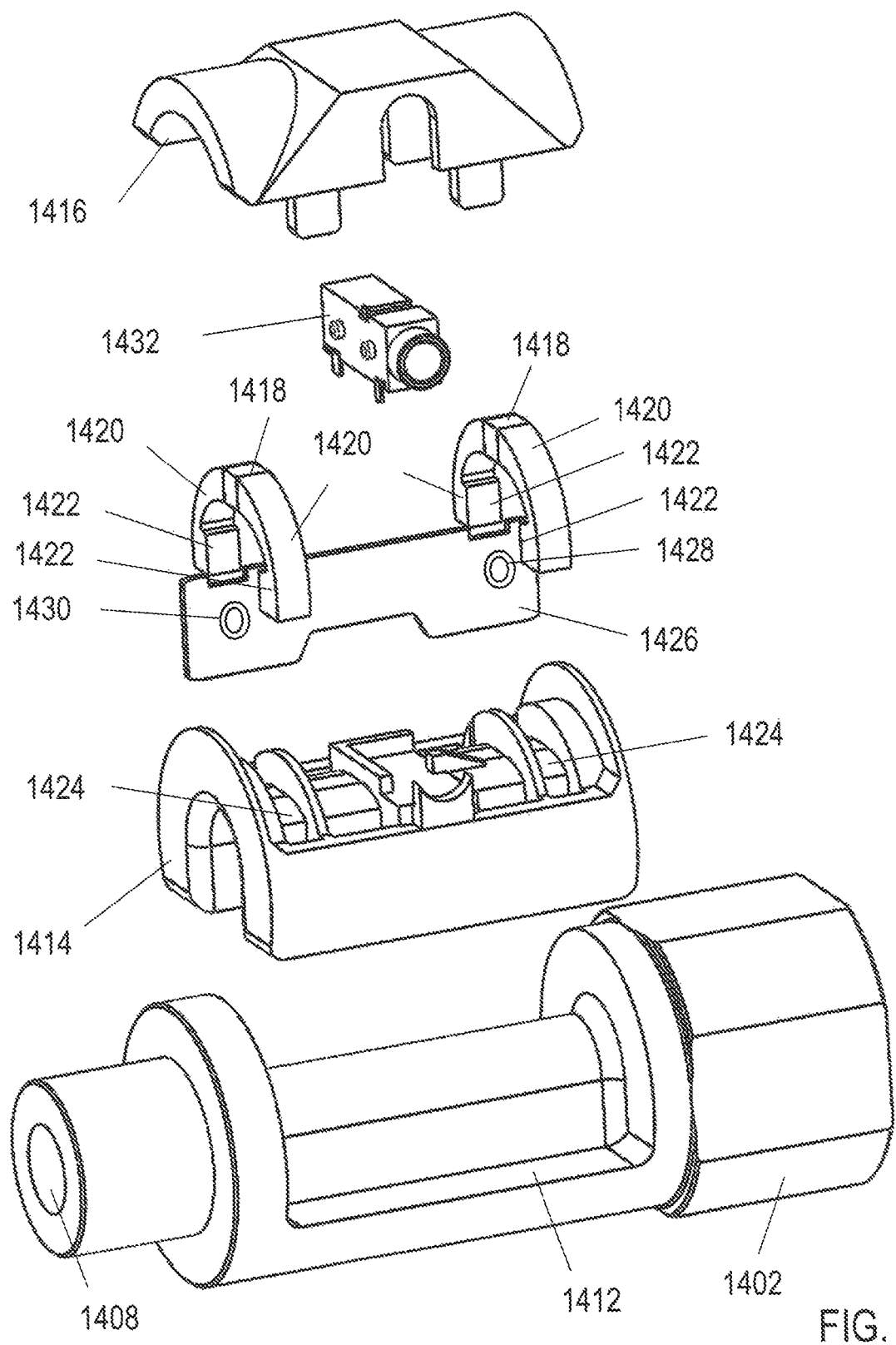

FIG. 14A shows an inline sensor module 1400. FIG. 14B shows an exploded view of the components that make up sensor module 1400. As shown, sensor module 1400 includes a body 1402 having an externally threaded portion 1404 at one end and an internally threaded portion 1406 at the opposite end. Internal threads in internally threaded portion 1406 allow sensor module 1400 to thread onto a barrel of a firearm. External threads on externally threaded portion 1404 allow an additional muzzle device to thread onto sensor module 1400, thus allowing a user to install sensor module 1400 onto a firearm while still using a preferred muzzle device. Bore 1408 extends axially through body 1402 and is configured to allow a bullet to pass through sensor module 1400.

Sensing unit 1410 fits over a saddle-shaped recess 1412 in body 1402. Sensing unit 1410 includes a main body 1414 and a cover 1416. Magnets 1418 are located between flux guides 1420, with magnets 1418 oriented so that one pole faces one flux guide and the other pole faces the other flux guide. Flux guides 1420 provide a low-reluctance return path to guide the magnetic field. Flux guides 1420 may be made of a low reluctance material such as a ferromagnetic material. Thus, the magnetic field passes from one pole of magnet 1418 through the adjacent flux guide to the flux guide end. The magnetic field then traverses the gap between the flux guide ends 1422 to the opposing flux guide end, through the other flux guide and into the other pole of magnet 1418. Magnets 1418 and flux guides 1420 are held in cavities 1424 in main body 1414 such that the magnetic field from flux guide ends 1422 passes through body 1402 and into bore 1408. Alternatively, additional magnets may be used to provide a return path for the magnetic field, similar to a Halbach array. Use of flux guides or additional magnets allows for smaller magnets and a more concentrated magnetic field, reducing crosstalk between the sensor coils (discussed infra). Such a guided magnetic field would also be less sensitive to other ferromagnetic objects nearby, such as the firearm barrel or attached muzzle device. A circuit board 1626 containing sensor coils 1428 and 1430 is u located longitudinally within main body 1614. Sensor coils 1428 and 1430 may be aligned axially with the magnets and/or flux guide ends so as to be in the strongest magnetic field. A flexible circuit board may be used which can be curved around the bore to create sensor coils contoured more closely to the bullet. An electrical connector 1432, such as a 3.5 mm headphone jack, is electrically connected to first and second sensor coils 1428 and 1430 in circuit board 1626 and allows for a removable connection to a controller.

During operation, a bullet fired from an attached firearm passes through bore 1408, disrupting the magnetic field within the bore. First sensor coil 1428 and second sensor coil produce a signal due to the changing magnetic field. The signals travel from the sensor coils and circuit board 1426 through electrical connector 1432 to a connected controller to determine the velocity of the bullet. The velocity may be determined by identifying a first time based on the first signal and a second time based on the second signal. The distance between the first and second sensor coils is divided by the difference between the first time and the second time to obtain the velocity.

Sensing unit 1410 may be easily removable from body 1402, thus resulting in a modular sensor module. A modular sensor module may be advantageous for many reasons. For example, sensing unit 1410 may be removed to prevent damage when not in use and, in the event damage was to occur, allow for easy replacement. Several configurations of body 1402 may be developed, such as with different thread configurations to accommodate various firearm barrels, allowing one sensing unit to be swapped among several firearms. Various sensing units may also be developed which can easily be swapped out, allowing a user to select an appropriate sensing unit for a particular application or to upgrade a sensing unit to a new model.

Creating an inline chronograph presents additional challenges not encountered with larger chronograph designs, such as traditional optical chronographs or even bayonet-style chronographs disclosed herein. One challenge is minimizing error in the computed velocity. One source of error in a measured velocity is caused by variations in spacing between the first and second sensor coils. One method of creating accurately spaced sensor coils is by forming the sensor coils by a metal trace within a printed circuit board. Printed circuit boards can thus be used to create accurately spaced sensor coils while also being inexpensive to mass produce. Even printed circuit boards have manufacturing tolerances and as the distance between the sensor coils decreases, the percentage of error increases for a given manufacturing tolerance. For example, halving the distance between the sensor coils doubles the error. Calibration may therefore be required to maintain accuracy. A correction may be applied to signals or a calculated velocity to compensate for error.

Another issue encountered in inline chronographs is that as the axial distance between the sensor coils is decreased, there may be "crosstalk" between the sensor coils. Crosstalk is created when a bullet passing through the magnetic field at one sensor coil also causes a signal at another sensor coil. Crosstalk may distort the signal and thus create error in the calculated velocity.

One way to reduce crosstalk and other sources of signal error is through the use of one or more compensation coils. A compensation coil is any coil that is not the coil producing the primary signal at a specific moment in time.

Figure 15A:
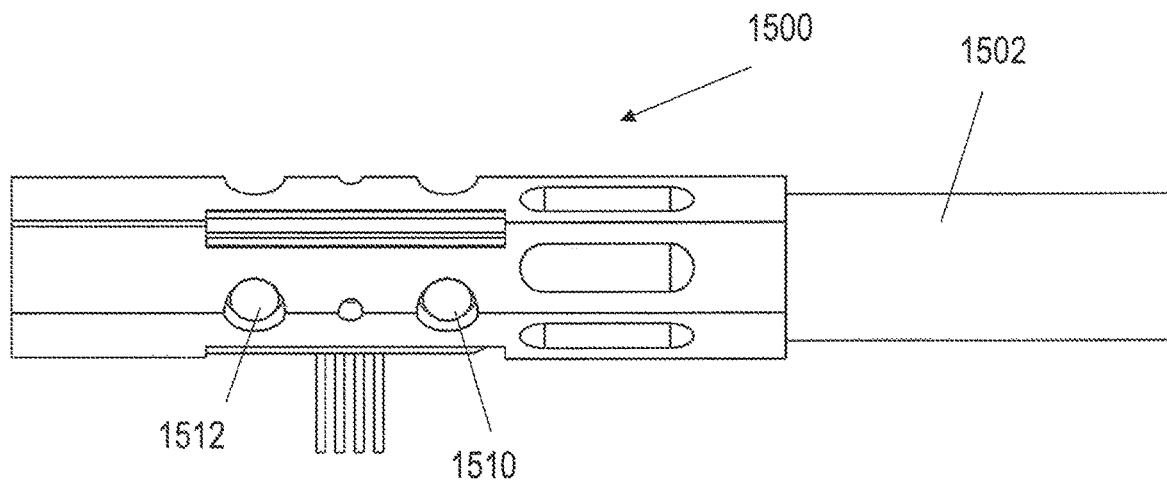
FIGS. 15A-15B show an inline sensor module having a compensation sensor.
Figure 15B:
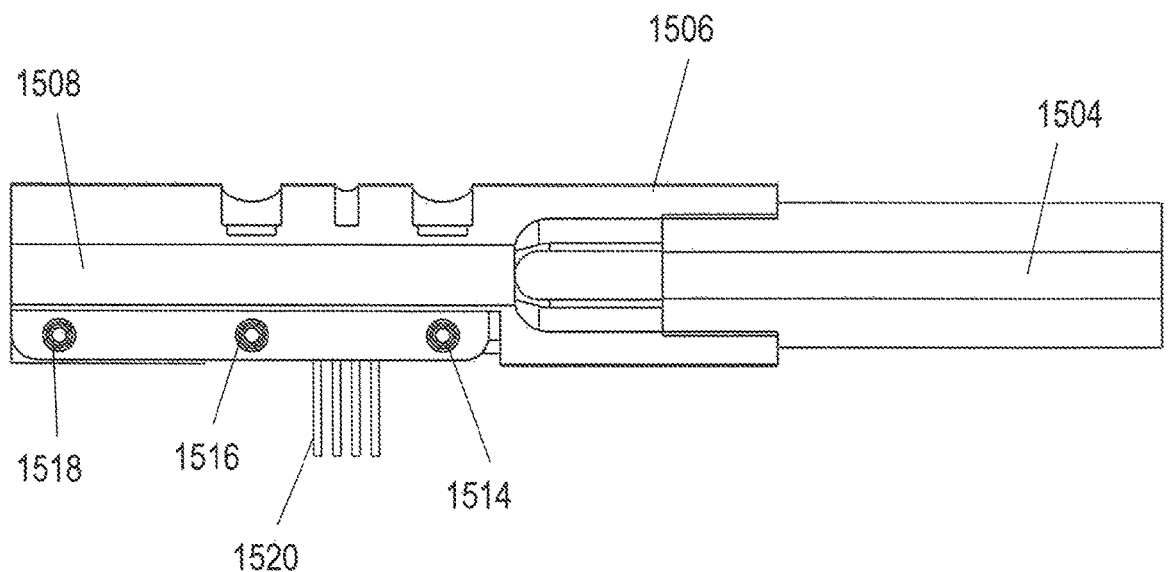

FIGS. 15A and 15B depict an inline sensor module having a compensation sensor. FIG. 15A shows a side view of a sensor module 1500 mounted on a barrel 1502 of a firearm. FIG. 15B is a sectional view of FIG. 15A cut along the centerline of bore 1504 of the firearm. The embodiment in FIG. 15A includes a body 1506 having a bore 1508 configured to allow a bullet from the firearm to pass therethrough. A first magnet 1510 and a second magnet 1512 are substantially aligned with first sensor coil 1514 and second sensor coil 1516, respectively. Compensation coil 1518 is displaced axially downstream from second sensor coil 1516 and does not have a magnet substantially aligned therewith.

During operation, a bullet fired from the firearm exits bore 1504 of the firearm and enters bore 1508 of the sensor module. As the bullet passes by the first sensor coil 1514, the bullet disturbs the magnetic field around first sensor coil 1514, which is primarily the magnetic field from first magnet 1510. The disturbed magnetic field produces a voltage in first sensor coil 1514 which is transmitted through leads 1520 to a controller. As the bullet passes by second sensor coil 1516, the bullet likewise disturbs the magnetic field around the second sensor coil, which is primarily created by the second magnet 1512. A voltage is produced by the second sensor coil which is transmitted through leads 1520 to a controller. As the bullet passes through bore 1508 of the chronograph, compensation coil 1518 may also produce a voltage. The voltage produced in compensation coil 1518 is sent as a signal through leads 1520 to a controller. The controller may then use the signal produced by compensation coil 1518 to compute the velocity in conjunction with the signals from the first and second sensor coils.

The controller may receive the data from the first and second sensor coils and the compensation coil and apply a correction to the signal produced by the first sensor coil, the signal produced by the second sensor coil, any parameters used in determining the velocity, or the computed velocity. For example, the controller may combine or subtract signals either in hardware or software.

The correction applied may be a fixed value (e.g., 1.5%), or may change based on velocity (e.g., 0.5% for every 1,000 fps) or other parameters. The type of correction and the value used for the correction may be determined automatically or by user input. A user may input a specific correction to be used or may input parameters such as the gun, cartridge, or environmental conditions and the controller may apply a correction based on the input parameters.

In other embodiments, one or more compensation coils may be used which may be located on a separate circuit board from other coils and may be positioned anywhere on a sensor module, such as parallel, co-planar, orthogonal, or oblique to the first and second sensor coils. A compensation coil may be aligned axially anywhere desired, including before the first sensor coil, after the second sensor coil, between the first and second sensor coil, or aligned with the first or second sensor coil.

Another method for reducing crosstalk between sensor coils is to orient the magnets or sensor coils in order to minimize the signal produced by the other sensor coil. For example, the second magnet and second sensor coil may be oriented orthogonally to the first magnet and the first sensor coil such that the magnetic field from the first magnet is approximately parallel with second sensor coil, thus reducing the voltage created at the second sensor coil as the bullet passes by the first sensor coil.

Crosstalk may also be eliminated by using a sensor module having a single magnet and single sensor coil. Such a design could be more compact that a multiple-sensor coil design and would eliminate errors found in multiple-sensor coil designs such as those due to crosstalk and variations in sensor coil spacing. With a single-sensor coil design, the velocity could be estimated based on the shape of the signal produced by the sensor coil rather than calculated by the time it takes for a bullet to travel a distance.

Many methods may be employed to estimate the bullet velocity based on signal shape. For example, the velocity may be estimated by comparing the shape of the signal to a reference signal. Characteristics such as signal length, peak voltage, or signal slope may be used to estimate the velocity.

As has been described, the present invention provides an improved apparatus for measuring velocities of projectiles launched from firearms.

While the invention has been particularly shown and described with reference to a preferred embodiment, it will be understood by those skilled in the art that various changes in form and detail may be made therein without departing from the spirit and scope of the invention.

What is claimed is:

1. An apparatus for measuring velocities of projectiles launched from a firearm, the apparatus comprising:
   a stationary clamp arm, wherein the stationary clamp arm includes a stationary arm barrel pad made of a flexible material;
   a movable clamp arm works in concert with the stationary clamp arm to form a clamp for clamping the apparatus to a firearm;
   a thumbscrew for securing the movable clamp arm and the stationary clamp arm to the firearm; and
   a sensor module integrated to the stationary clamp, wherein the sensor module includes
      a first and second sensor coils;
      a first magnet adjacent to the first sensor coil; and
      a second magnet adjacent to the second sensor coil.

2. The apparatus of claim 1, wherein the sensor module and the stationary clamp are formed by two molded plastic structures.

3. The apparatus of claim 2, wherein the stationary clamp includes ribs to provide structural integrity.

4. The apparatus of claim 1, wherein the stationary clamp arm barrel pad is V-shaped.

5. The apparatus of claim 1, wherein the movable clamp arm includes a movable clamp arm barrel pad made of a flexible material.

6. The apparatus of claim 1, wherein the stationary clamp arm and the stationary arm barrel pad are tapered to allow the apparatus to be attached to
   a non-tapered firearm portion when the stationary arm barrel pad is placed in a first orientation, and
   a tapered firearm portion when the stationary arm barrel pad is placed in a second orientation.

7. The apparatus of claim 1, further comprising a barrel nut and a swivel such that the thumbscrew passes through the swivel, the movable clamp arm, the stationary clamp arm, and threaded into the barrel nut in order to cause a clamping force to secure the apparatus onto the firearm.

8. The apparatus of claim 1, further comprising a controller for receiving information from the first and second sensor coils in order to determine a velocity of a projectile coming from the firearm.

9. An apparatus for measuring velocities of projectiles launched from a firearm, the apparatus comprising:
   a sensor module having
      a first and second sensor coils;
      a first magnet adjacent to the first sensor coil; and
      a second magnet adjacent to the second sensor coil; and
   a clamp having
      a first and second clamp arms for clamping to a firearm; and
      a thumb screw for securing the two clamp arms to the firearm; and
      a tube removably secured to the sensor module while allow the clamp to slide along a longitudinal axis of the tube to position the sensor module in relation to a muzzle of the firearm.

10. The apparatus of claim 9, wherein the first clamp arm includes a first barrel pad, and the second clamp arm includes a second barrel pad.

11. The apparatus of claim 9, further comprising a first attachment module that includes
   a first plate having a first channel for receiving a Picatinny-style rail;
   a second plate having a second channel for receiving the Picatinny-style rail; and
   a bore collar having a center bore for receiving the tube.

12. The apparatus of claim 11, further comprising a second attachment module that includes
   a main body and a clamp body to form a clamp for receiving a dovetail mount; and
   a Picatinny-style rail located on the main body.

13. The apparatus of claim 11, further comprising a second attachment module that includes
- a main body and a clamp body to form a clamp for receiving a dovetail mount;
- an adapter body attached to the main body; and
- a Picatinny-style rail located on the adapter body.

14. The apparatus of claim 11, further comprising a second attachment module that includes
- a plurality of clam arms for gripping a barrel stock;
- a thumbscrew for securing the clam arms to the barrel stock; and
- a Picatinny-style rail located on the clam arms.

15. The apparatus of claim 9, wherein the first and second sensor coils are formed by a single trace in a printed circuit board.

16. The apparatus of claim 9, wherein the sensor module further includes an electronics module having a battery.

\* \* \* \* \*